US010008370B2

(12) United States Patent
Ohmori et al.

(10) Patent No.: US 10,008,370 B2
(45) Date of Patent: Jun. 26, 2018

(54) PLASMA PROCESSING APPARATUS AND OPERATION METHOD THEREOF

(71) Applicant: HITACHI HIGH-TECHNOLOGIES CORPORATION, Minato-ku, Tokyo (JP)

(72) Inventors: Takeshi Ohmori, Tokyo (JP); Daisuke Satou, Tokyo (JP); Tatehito Usui, Tokyo (JP); Satomi Inoue, Tokyo (JP); Kenji Maeda, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days. days.

(21) Appl. No.: 14/973,592

(22) Filed: Dec. 17, 2015

(65) Prior Publication Data

US 2016/0177449 A1    Jun. 23, 2016

(30) Foreign Application Priority Data

Dec. 19, 2014  (JP) ................................. 2014-256786

(51) Int. Cl.
*C23C 16/513*     (2006.01)
*H01J 37/32*      (2006.01)

(52) U.S. Cl.
CPC .... *H01J 37/32917* (2013.01); *H01J 37/3299* (2013.01); *H01J 37/32926* (2013.01); *H01J 37/32972* (2013.01)

(58) Field of Classification Search
CPC ........... H01J 37/32917; H01J 37/32926; H01J 37/3299; H01J 37/32972
See application file for complete search history.

(56) References Cited

U.S. PATENT DOCUMENTS 5,759,424 A    6/1998  Imatake et al.

FOREIGN PATENT DOCUMENTS

| JP | 02170971 A | * | 7/1990 |
| JP | 5259250 A |  | 10/1993 |
| JP | 8-106992 A |  | 4/1996 |
| JP | 10102251 A | * | 4/1998 |
| JP | 11140655 A | * | 5/1999 |

(Continued)

OTHER PUBLICATIONS

Office Action dated Dec. 2, 2016 for related Korean Patent Application No. 10-2015-0180178.

(Continued)

*Primary Examiner* — Yuechuan Yu
(74) *Attorney, Agent, or Firm* — Miles & Stockbridge P.C.

(57) ABSTRACT

A plasma apparatus of processing a wafer disposed in a processing chamber using plasma includes one window, another window, a light receiving unit, a light source, and an optical branching unit which is disposed between the light source and the other window, branches light emitted by the light source to an optical path toward the processing chamber and an optical path in other direction, and reflects light in the processing chamber from the other window, and a detection unit which detects the light having been emitted from the plasma and received by the light receiving unit using one branched light and other branched and reflected light. The apparatus processes the wafer according to a condition for the processing which is adjusted based on a result of the detection.

5 Claims, 13 Drawing Sheets

(56) References Cited

FOREIGN PATENT DOCUMENTS

| JP | 2002-246320 | A | 8/2002 |
|----|-------------|----|---------|
| JP | 2003-264175 | A | 9/2003 |
| KR | 0152355 | B1 | 12/1998 |

OTHER PUBLICATIONS

Office Action dated Jul. 18, 2017 for related Korean Patent Application No. 10-2015-0180178.

* cited by examiner

FIG.2

| LIGHT TO BE MEASURED | SHUTTER OPEN AND CLOSE | | | | |
|---|---|---|---|---|---|
| | 27a | 27b | 27c | 27d | 27e |
| REFERENCE EXTERNAL LIGHT | OPEN | CLOSE | CLOSE | OPEN | CLOSE |
| INNER-WALL-TRANSMITTING EXTERNAL LIGHT | CLOSE | OPEN | CLOSE | OPEN | OPEN |
| LIGHT-RECEPTOR-SIDE PLASMA LIGHT | CLOSE | CLOSE | CLOSE | — | OPEN |
| INNER-WALL-REFLECTED EXTERNAL LIGHT | CLOSE | OPEN | OPEN | OPEN | CLOSE |
| RADIATOR-SIDE PLASMA LIGHT | CLOSE | OPEN | OPEN | CLOSE | CLOSE |

- 52 SOCKET
- 140 CONDENSER LENS
- 51 DISCHARGE NEEDLE
- 50 LIGHT SOURCE EMITTER
- 22 EXTERNAL LIGHT SOURCE PORT
- 53 LAMP BULB
- 54 LAMP CASE

- 60 SPECTROSCOPIC SLIT
- 61 BUNDLE
- 62 BUNDLE
- 63 BUNDLE

- 60 SPECTROSCOPIC SLIT
- 61 BUNDLE
- 62 BUNDLE
- 63 BUNDLE

- 17 REFERENCE LIGHT PORT
- 190 DIAGONAL MIRROR WITH HOLE
- 20 SPLITTER HOLDER
- 18 REFLECTION PORT

DISCHARGE TIME (s)
FILM THICKNESS (nm)

PLASMA PROCESSING APPARATUS AND OPERATION METHOD THEREOF

BACKGROUND OF THE INVENT ON

The present invention relates to a plasma processing apparatus that processes a substrate-like sample, such as a semiconductor wafer, arranged in a processing chamber disposed in a vacuum chamber using plasma formed in the processing chamber, and a method of operating the plasma processing apparatus, and in particular to a plasma processing apparatus that adjusts the sample processing using a result of detecting light from the processing chamber, and a method of operating the plasma processing apparatus.

In order to improve the performance of a semiconductor device, nanometer-level processing accuracy is required in a stage of processing a film structure having multiple film layers that include a mask layer and a film layer to be processed. The mask layer is preliminarily formed on a wafer surface to form circuits of the device on the surface of the substrate-like sample, such as a semiconductor wafer, by means of plasma etching. Furthermore, for the sake of improving the productivity of such a device, it is required to consecutively process wafers as many as possible while maintaining the accuracy in a wafer processing apparatus.

Unfortunately, such a consecutive operation of the stage in a mass production increases the time during which the inner walls of the processing chamber are exposed to plasma. The increase wears the inner wall itself, and deposits plasma-resistant compounds on the surface of the inner wall. Consequently, the state of the surface of the inner wall varies with the lapse of time. Such a variation in the material of the surface of the inner wall, in turn, varies the reactivity in plasma, the amount of disappearance of deposited radicals from the surface of the inner wall, and the amount of atoms and molecules released by reactions between the plasma and the material of the inner wall. The variations affect the plasma to vary the characteristics of this plasma accordingly.

These variations, in turn, vary the composition of the radicals and charged particles that constitute the plasma. If the variation resultantly varies the dimensions of the shape of the structure after processing to cause the amount of variation to exceed the permissible range, a semiconductor device obtained from the processed wafer becomes a defective piece, which reduces the production in yield. Consequently, the production cannot be continued. If the amount of deposition of such accretion on the surface of the inner wall increases, some of the accretion is separated from the surface, to which they have been accreted, to form shards and particles again toward the inside of the processing chamber. If the isolated substances are attached onto a surface of the wafer, the film structure is contaminated even through a process capable of achieving desired dimensions. The contamination reduces the production in yield as described above.

One of techniques of controlling the variation in processed shape described above is a technique that monitors the plasma state and apparatus state, feeds back the result of monitoring to adjust the plasma processing setting, and actively controls the processed shape (hereinafter, referred to as APC: Advanced Process Control). Among monitors for the plasma state, a spectroscopic (hereinafter, referred to as OES: Optical Emission Spectroscopy) monitor, which acquires a spectrum of plasma light, is adopted and applied to APC.

The plasma light is released when atoms or molecules having been excited by collision with electrons are de-excited in the plasma. Consequently, OES data reflects the amount and types of radicals, the electron number density, and the energy distribution in the plasma, thereby allowing the variation in plasma state to be obtained.

A processing chamber of a plasma apparatus for semiconductor processing is operated in a vacuum or reduced pressure atmosphere. Consequently, plasma light is obtained through the inner walls of the apparatus that allows the plasma light to pass, or a window or the like provided in the vacuum chamber walls. The plasma light obtained by OES is thus affected by the variation in the plasma light itself, and by reflection, scattering and the like caused in a process of the plasma light passing through the processing chamber wall.

Cases are assumed where even with different surface of the inner wall, the plasma states are controlled to be the same to thereby achieve the same processed shape. The plasma light before passing through the inner walls is the same between these cases. However, OES data obtained after the plasma light passes through the inner walls varies. Consequently, in order to achieve nanometer-level highly accurate APC, both the plasma light itself and variation in the inner surfaces are required to be obtained.

Conventionally, as these techniques, techniques disclosed in JP-A-2003-264175 and JP-A-H08-106992 have been known. For example, according to JP-A-2003-264175, light from an external light source (hereinafter, referred to as external light) is caused to be incident through a side of a processing chamber. A reflector provided on the surface of a side wall of the processing chamber on the opposite side is used to reflect the incident light.

This conventional technique corrects the OES data on the plasma light having passed through the surface of the inner wall using the OES data on the external light having passed through the inner wall, thereby obtaining the OES data on the plasma light before passing through the inner wall. According to JP-A-H08-106992, external light having entered from a side of a processing chamber is caused to pass through a side wall of the processing chamber on the opposite side to the outside. OES data on the external light having passed through the inner wall is used to obtain OES data on the plasma light before passing through the inner wall in a similar manner.

Furthermore, measures are taken according to which before start of a process of forming a circuit structure on a surface of a wafer, a coating step of forming a desired coating film on the surface of inner wall of the processing chamber is performed to stabilize the interaction between the inner surface of the processing chamber and plasma which is to be generated during wafer processing, thanks to presence of the coating film, thereby reducing variation in plasma characteristics and, in turn, temporal variation in processing results. Thus, such a conventional technique preliminarily forms the coating film so as to allow the film to last on the surface of the inner wall of the processing chamber from the start to the end of wafer processing, thereby reducing the variation in the state of the inner surface of the processing chamber.

As an example of such a conventional technique, a technique disclosed in JP-A-2002-246320 is also known. According to JP-A-2002-246320, in a state where products adhere onto a surface of metal of which inner walls of a processing chamber are made, the state of the film of accretion is detected using a result of detecting variation in the intensity of the interference light that includes reflected light from the surface of the inner wall made of the metal and from the surface of the film made of the accretion. This conventional technique discloses a technique that finishes cleaning so as not to expose the surface of the metal of which the inner walk of the processing chamber are made, on the basis of the detection result.

SUMMARY OF THE INVENTION

These conventional techniques cause problems because the techniques do not sufficiently consider the following points.

That is, as described above, in a wafer processing for producing semiconductor devices using plasma etching, it is required to continue mass production while maintaining nanometer-level processing accuracy. For APC for this requirement, highly accurate OES data on plasma light is required that allows nanometer-level processing variation to be evaluated.

OES obtains information using plasma light having passed through the inner walls of an apparatus. Consequently, a variational component of the data contains not only the variation of the plasma light itself but also the variation in the state of the surface of the inner wall of the processing chamber through which the plasma light has passed. These variations are required to be isolated from each other. Thus, for the sake of accurately detecting the state during processing a substrate-like sample, such as a semiconductor wafer, which is a member to be processed, it is required to extract, from the OES data, the variational component on the surface of the inner wall and the variational component of plasma light emission in a manner separated from each other.

The surface of the inner wall of a processing chamber inside a vacuum chamber after start or the operation of a plasma processing apparatus used for mass production of semiconductor devices are typically worn down owing to the interaction between the member of the surface of the inner wall and plasma, or, onto these surfaces, compounds formed by chemical combination between the member of the surface and gas in the plasma or the processing chamber adhere and deposit. Furthermore, there is a case where compounds formed by a reaction in the plasma or on a surface of a sample deposits on the surface of the inner wall having been worn down by the above two causes.

The present inventors used a processing chamber whose surface of inner wall were cleaned after stopping the operation or a processing chamber having never been subjected to operation, and started an operation of continuously or intermittently processing, on a piece by piece basis, a predetermined batch of number of samples which belonged to the same type and on which the same film structure was formed, subsequently measured the surface of the inner wall from a state close to that of a new one at the beginning of the operation to a state after completion of processing through the middle or all of the scheduled number of samples, and measured the temporal variation. As a result, it was found that the state of the surface of the inner wall were worn down with the lapse of time during which the walls were exposed to the plasma, and on the smooth and clean surfaces at the start of operation, the surface roughness and the thickness and amount of deposit gradually increased.

FIG. 15 is a graph schematically showing the distribution of surface roughness of the surface of an inner wall of a processing chamber of a plasma processing apparatus according to a conventional technique at different positions in the vertical direction on the surface of the inner wall of the processing chamber. As shown in this diagram, the distribution was found out that after exposure plasma for several hours to several hundred hours, irregularity or spherical surface roughness to an extent of 100 μm at the most occurred, and the surface roughness was different according to the position in the height direction on the inner wall and was larger on the surface of the inner wall at a relatively lower part. It was further found out that if the compounds of the member of the surface of the inner wall and the gas or plasma in the processing chamber were deposited, the thickness and amount of deposit had specific distributions according to the position on the surface of the inner wall.

Consequently, it can be understood that when external light and plasma light having passed through the inner walls are obtained by OES, the degrees of effects of reflection, scattering and the like caused in a process of both types of the light having passed through the processing chamber wall are different according to the position and area where the light passes through the surface of the inner wall. In the case of using data obtained by detecting the state of the position and area on the surface at a site of the inner wall where plasma light emission is detected for the sake of highly accurately detecting data on OES though use of the plasma light, these position and area are required to coincide with the position and area on the surface of the inner wall through which plasma light passes during emission of this light.

According to the technique disclosed in JP-A-H08-106992, in the case of obtaining external light and plasma light having passed through an inner wall of a processing chamber, optical fibers are arranged such that the sections of axes of the fibers at ends for light emission and light reception face with each other on both sides of the surface of the inner wall of the measurement target. According to such a configuration, the ends of fibers which constitute the optical fiber bundle have an incidence angle that coincides with the maximum incidence angle (typically, having the same value as the maximum radiation angle) according to the number of apertures. Light emitted from the outside of the processing vessel (processing chamber) through the end faces of the optical fibers to the inside in order to detect the state of the inner walls is diffused from the end faces. A component of the emitted light within the maximum radiation angle enters the processing chamber. On the light reception side through the transmitting member arranged on the surface of the inner wall on the opposite side, a component of the light within the maximum incidence angle is obtained.

According to such an arrangement, the ratio of the component of light having emitted from the end faces on the light emission side, passed through two chamber walls at the opposite sites without the path being bent and entered the end faces of fibers on the light reception side in the entire radiated light is significantly small because the ratio corresponds only to the component passing along the line between the axes of the fibers on both the sides. It can be considered that most of the external light having diffused and radiated is received after being reflected at least one time by the wall surface in the processing chamber at sites other than the opposite sites. Thus, data on OES obtained from the light having passed though the surface of the inner wall and enter the end faces on the light reception side are affected by all the states of the surfaces arranged on the path on which the light passes.

Meanwhile, plasma-emitted light is from a bulk plasma component residing in the bulk of areas in the processing chamber. Consequently, it can be considered that in the intensity of light incident on the end faces on the light reception side, the ratio of the component of light directly incident without being reflected is relatively higher than the intensity of the component of light reflected by the metal walls. According to the above description, the positions on the surface of inner wall and the numbers of light passing therethrough are different between those of the external light and those of the plasma light. Furthermore, the state of the surface of the inner wall has a specific distribution as described above. Consequently, there is a problem in that even in the case of using the OES data on the external light, variation in OES data on the plasma light itself cannot be obtained.

The JP-A-H08-106992 discloses the configuration that includes a condenser lens arranged on a light reception side. This configuration can eliminate the component of reflected light in the received light. Unfortunately, this case causes a problem in that the positions and areas on the surface of the inner wall where external light passes through are different between those on the radiation side and those on the light reception side.

For example, the ratio of areas between them is the ratio between values obtained by squaring the two distances from the radiation position to the surface of the inner wall on the incident side and the light reception side. In the case of a processing chamber accommodating a wafer with a diameter of 200 mm, it is assumed that the distances from the radiation position to the surface of the inner wall on the radiation side and the light reception side are 10 mm and 300 mm, respectively. According to this assumption, the ratio of areas of both the surfaces becomes 900. It is thus very difficult to accurately obtain variation in OES data on plasma light itself.

In this case, it is further assumed that as to the area through which the external light passes, the diameter of on the light reception side is φ10 mm; the diameter on the radiation side becomes approximately φ0.33 mm. As described above, the size of surface roughness on the surface of the inner wall increases up to approximately 100 μm at the most. In the case where such deposit and surface roughness are particularly included on the surface of the inner walls on the radiation side, there is a problem in that OES data on the external light largely varies.

Accurate evaluation of the state of the inner walls of the processing chamber through which light from plasma or light supplied from the outside requires highly accurate detection of the spectrum of light passing through the surface of the inner walls. For meeting this requirement, it is required to obtain data on light itself that is introduced from the outside and detected by OES (i.e., light before being introduced into the processing chamber) and OES data on the external light having passed through the surface of the inner wall, highly accurately compare both the data items with each other, and detect the difference.

For allowing the light to enter the processing chamber from the outside and detecting the state of the inner walls, multiple optical paths supporting the measurement target are required to be used. Each of light components to be measured is allowed to enter a spectroscope, and the OES data is obtained. For obtaining the OES data items on each of components to be measured and highly accurately comparing the data items with each other, an error due to each optical path and an error caused by the individual difference of the spectroscope are required to be reduced.

For evaluating the state of the inner walls using the external light, multiple optical paths supporting the measurement target are required to be used. Each of light components to be measured is allowed to enter a spectroscope, and the OES data is obtained. For obtaining the OES data items on each of components to be measured and highly accurately comparing the data items with each other, an error due to each optical path and an error caused by the individual difference of the spectroscope are required to be reduced.

According to JP-A-2002-246320, interference light due to reflected light from the surface of the metal of which the inner walls of the processing chamber is made and from the surface of a film formed by deposition of accretion is used to detect the state of the film. Since the surface of the inner walls is made of metal, most components of the incident light are reflected. Consequently, the interference light can be measured at a sufficient intensity.

However, in the case where a material having a high light transmittance is adopted for the inner walls of the processing chamber, even if the inner wall member of the processing chamber is irradiated with light from the outside, most of components of light having entered the inner walls pass toward the processing chamber. As described above, light having passed through the inner walls made of such a material is reflected by the surface of the vacuum chamber wall and the like that constitute the processing chamber to become stray light. The stray light acts as a noise to the interference light due to the reflected light from the inner walls and the surface of the film and becomes noise when the interference light is detected.

For example, 93% or more of light in a visible light range from the outside with which the inner walls are irradiated in order to detect the state of the film of accretion deposited on the surface of the inner walls made of quartz passes through the inner walls and is incident on the film of the accretion deposited on the surface of the inner walls. Meanwhile, in the condition of processing the wafer with typical plasma, the film of accretion deposited on the surface of the inner wall is a thin film having a thickness of no more than 10 micrometers. In the case where the film is made of organic film or SiO, 90% or higher of the light incident on the film passes into the processing chamber. In the case of some types of deposit film, 99% or higher light passes into the processing chamber.

That is, a light component reflected by the interface between the surface of the inner wall made of quartz and the film of accretion and by the interface between this film and the space in the processing chamber is 10% or less in the light incident on the film. The component is 1% or less for some types of films. As described above, the light having passed into the processing chamber and been reflected and acting as a noise has an intensity 10 to 100 times as high as the intensity of the interference light caused by the reflected light from the inner wall member and the film of accretion on the surface of the inner wall member. Consequently, for accurately measuring the state of the deposit film using the interference light, the noise during measurement due to the light having passed into the processing chamber is required to be reduced.

The above conventional techniques do not consider these problems. Consequently, the state of processing in the processing chamber cannot be accurately detected. It is therefore difficult to accurately determine the condition of processing for obtaining a desired result using a result of detecting the light in the processing chamber. Alternatively, the degree of deviation of an obtained processing result from a desired result is large and out of the permissible range. Consequently, the yield is reduced.

An object of the present invention is to provide a plasma processing apparatus with increased yield or a method of operating the same.

Accordingly, embodiments include a plasma apparatus of processing a wafer disposed in a processing chamber disposed in a vacuum chamber using plasma formed in the processing chamber, including: a first window which is disposed on a side wall on one side of the vacuum chamber surrounding the processing chamber and through which light emitted from the plasma passes; a second window which is disposed on another side opposite to the first window sandwiching the processing chamber and through which external light from outside of the processing chamber passes; a light receiver which is disposed outside of the first window and receives and detects light through the first window; a light source of the external light disposed outside of the second window; a controllable multiport optical branching device disposed between the light source and the second window which has a plurality of optical ports including a first optical port for a first optical path, a second optical port for a second optical path, and a third optical port for a third optical path of light, the first optical path and the second optical path of light being branched from light emitted by the light source, the first optical path of light being directed toward the processing chamber and the second optical path of light being directed to another direction which is different from the direction of the first optical path, and the third optical path of light being branched from light from the second window into yet another direction different from the directions of the first and second optical paths; and a detector configured to selectively receive one of the light paths from the controllable optical branching device including light from the first optical port having passed through the processing chamber and been received by the light receiver, and the light from the second optical port branched in the other direction and the light from the third optical port branching in yet another, and is configured to detect the light to detect the light having been emitted from the plasma and received by the light receiver using the lights from the controllable optical branching device. The apparatus further comprises a controller which is configured to adjust a condition for processing based on a result of the detection by the detector.

The plasma apparatus and processing method which highly accurately obtain OES data on external light and plasma light, and OES data on the plasma light itself and data on a surface state can be provided. Accordingly, highly accurate OES data on the plasma light, and data representing the state of the inner wall of the apparatus can be obtained. Furthermore, use of the obtained data can achieve a highly accurate APC.

Other objects, features and advantages of the invention will become apparent from the following description of the embodiments of the invention taken in conjunction with the accompanying drawings.

BRIEF DESCRIPTION OF THE DRAWINGS

FIG. 2 is a table showing an open and close combination of a shutter, and light to be measured on an optical path selected for each combination in the embodiment shown in FIG. 1;

DESCRIPTION OF THE EMBODIMENTS

The present invention includes a configuration that uses light emitted toward a processing chamber which is arranged from the outside to the inside of the vacuum chamber and in which plasma is formed, and detects the state of the surface of a member of which an inner wall of the processing chamber is made, and detects variation in light emitted from the plasma and variation in the state of the surface of the inner wall of the processing chamber. This configuration highly accurately detects OES data on reference light from the outside and light emitted from the plasma, and thus highly accurately detects this OES data and the state of the surface of the inner wall.

Furthermore, in order that a film of accretion formed during wafer processing and deposited on the surface of the inner wall, and the coating film formed on the surface of the inner wall before and after the wafer processing are irradiated with the reference light from the outside to accurately detect interference light caused by reflected light from the inner wall and the film, adverse effects of light passing into the processing chamber 100 and acting as a noise to the interference light are reduced. Such a configuration can highly accurately detect variation in the state of the film formed on the surface of the inner wall, and use the result of detection to achieve APC that highly accurately adjusts the processing condition so as to obtain a desired processing result.

Embodiments of the present invention are hereinafter described with reference to the drawings.

An embodiment of the present invention is now described with reference to FIGS. 1 to 8.

Figure 1:
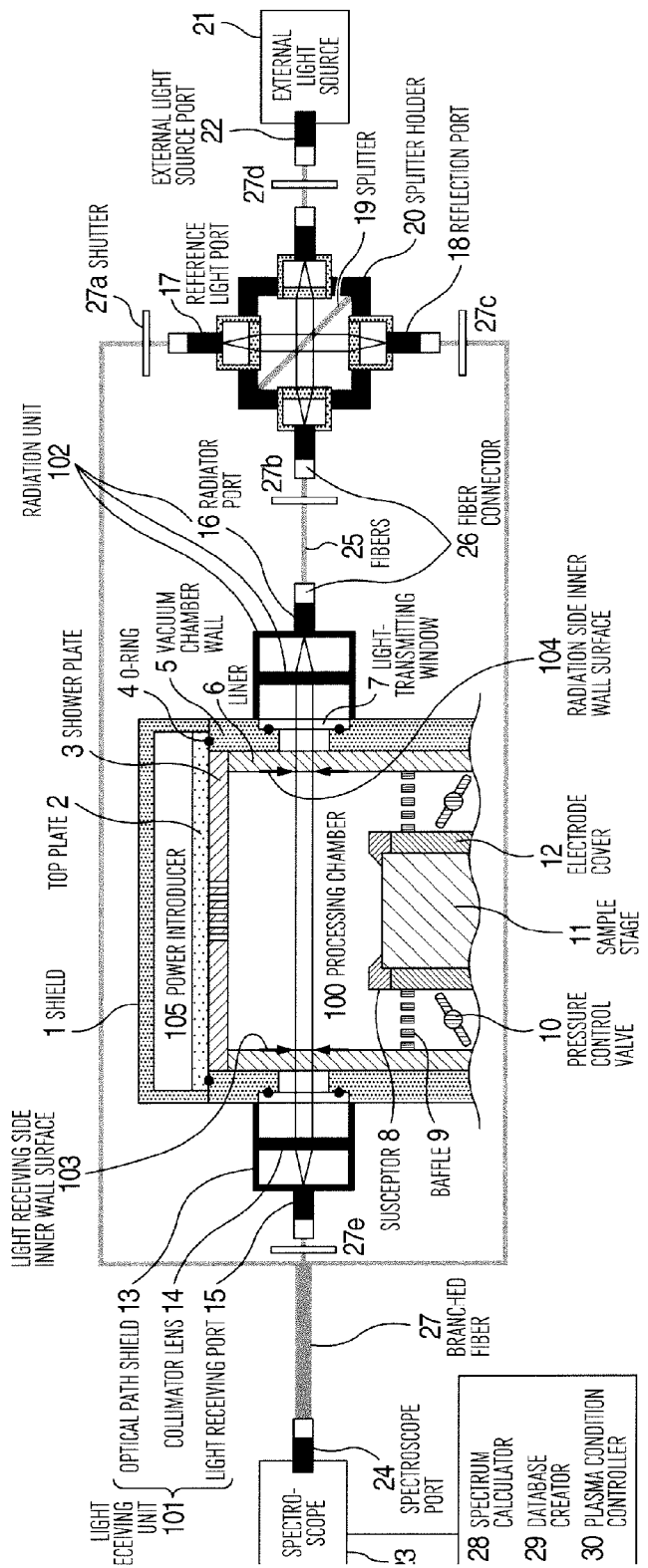
FIG. 1 is a longitudinal sectional view schematically showing an overview of a configuration of a plasma processing apparatus according to an embodiment of the present invention.

FIG. 1 is a longitudinal sectional view schematically showing an overview of a configuration of a plasma processing apparatus according to an embodiment of the present invention. This diagram shows a vacuum chamber of a the plasma processing apparatus, and a configuration that is arranged outside of the chamber and emits light to the inside or receives and detects light from the inside, in a specifically enlarged manner.

A processing chamber 100 arranged in an upper part of the vacuum chamber of this embodiment is a space in which a wafer to be processed is disposed. This space has a cylindrical shape surrounded by a vacuum chamber wall 5 having a cylindrical shape, and by a circular top plate 2 that is disposed on the upper end of the vacuum chamber wall 5, is made of a dielectric material, such as quartz, allowing an electric field to pass, and constitute the vacuum chamber. In this space, plasma is formed. A plurality of light-transmitting windows 7 that are included in the vacuum chamber wall 5, and made of material allowing light to pass between the processing chamber 100 at the inside and an outside atmospheric pressure space are arranged on the cylindrical member of the vacuum chamber wall 5 in a manner opposite to each other (at positions apart from each other by 180 degrees around the center) sandwiching the center of the cylinder.

Below the processing chamber 100, a vacuum pump, such as a turbomolecular pump, not shown, is arranged at a lower part of the vacuum chamber. An opening at a lower part of the processing chamber 100 communicates with an inlet of the vacuum pump through an evacuation path. Between these elements, multiple plate-formed flap valve, not shown, are arranged, and rotate to increase and reduce the sectional area of the evacuation path. The operation of these valves adjusts the flow rate, while the operation of the vacuum pump evacuates the inside of the processing chamber 100, which is decompressed to a predetermined degree of vacuum. Furthermore, the processing chamber 100 includes O-rings 4 between the upper end of the vacuum chamber wall 5 and the lower surface of the outer periphery of the top plate 2, and between the light-transmitting members of the light-transmitting windows 7 and a member constituting the cylindrical side wall of the vacuum chamber wall 5. These O-rings 4 are sandwiched by these elements, and hermetically seals a portion between the decompressed inside and the outside at the atmospheric pressure.

Above the top plate 2, a power introducer 105 is arranged in which an electric field to be supplied into the processing chamber 100 for forming plasma is formed or propagate. Means for supplying an electric field assumed in this embodiment may be a plate-shaped metal antenna where high-frequency power is supplied, electrodes or coils, a wave guide which forms microwaves by an oscillator, such as a magnetron, and in which the microwaves propagate, a coaxial cable in a duct and the like. The power introducers 105 may be a coil arranged to be wound around the outer periphery of the vacuum chamber wall 5, and a plate-shaped electrode arranged above the processing chamber 100. In this embodiment, high-frequency electric field having a high frequency ranging from 13.56 MHz to 10 GHz can be used as an electric field for generating plasma.

At a lower part in the processing chamber 100, a sample stage 11 having a cylindrical shape and a circular top surface on which a wafer to be processes is mounted is arranged. A base member that is a disc-shaped or cylindrical-shaped metal member arranged in the sample stage 11 is electrically connected to a high-frequency power source (not shown) through a matching box (not shown). In a state where a wafer is mounted or plasma is formed in the processing chamber 100, a high-frequency power with a frequency ranging from 100 kHz to 100 MHz is supplied to the base member, and bias potential for attracting charged particles, such as ions, in the plasma above the wafer or the upper surface of the sample stage 1 toward the surface of the wafer is formed.

In the metal base member of the sample stage 11, a coolant flow path is arranged which is arranged in a manner of multiple concentric circles or a spiral and in which coolant adjusted to have a predetermined temperature flows. Through the base member, the temperature of the sample stage 11 or the wafer are adjusted to have a value within a range suitable for processing. Furthermore, a heater may be arranged which is arranged to cover the base member or its upper surface, and in which electric power is supplied in a dielectric coating film for heating.

Moreover, in the dielectric coating film, film-formed multiple electrodes supplied with a direct current to attract a wafer by an electrostatic force formed between the electrodes and the wafer via the dielectric film for electrostatic chuck are arranged. On the upper surface of the coating film, a supply inlet for heat transfer gas is arranged. In a state where a wafer is mounted on the dielectric film, the heat transfer gas, such as He, is supplied to a gap therebetween to facilitate heat transfer A gas introduction port communicating with the supply inlet for the heat transfer gas is arranged through the base member and the dielectric film.

A shower plate 3 constituting a ceiling face of the processing chamber 100 is arranged facing the wafer mounting surface of the sample stage 11, under the top plate 2 and above the sample stage 11 in the processing chamber 100, and is provided at the center with multiple through-holes through which process gas for generating plasma flows and introduced into the processing chamber 100.

Furthermore, the processing chamber 100 may be provided with baffles 9 to efficiently enclose formed plasma within the space above the sample stage 11 in the processing chamber 100. The baffle 9 of this embodiment is arranged in a ring-shaped space between the outer peripheral side wall at an upper part of the sample stage 11 and the cylindrical inner wall of the vacuum chamber wall 5 defining the processing chamber 100, includes multiple through-holes allowing gas and particles in plasma in the upper part of the processing chamber 100 to pass and flow downward, and is made of a conductive member kept to a ground potential. Multiple plate-like pressure control valves 10 that rotate about the axis and adjust the sectional area of the flow path of a downward gas flow in the processing chamber 100 are provided below the baffles 9 in the processing chamber 100. Adjustment of the evacuation rate by the rotation of the valves, in turn, adjusts the pressure value in the processing chamber within a range suitable for processing.

The wafer to be processed is conveyed in a room that is a decompressed space in a vacuum chamber, not shown, communicating with the vacuum chamber wall 5 in a state of being mounted on and held by a distal end of an expandable and retractable arm of a conveyance robot, not shown, is passed onto the sample stage 11 in the processing chamber 100, and mounted on the upper face of the stage. In this state, after the arm of the conveyance robot is retracted from the inside of the processing chamber 100 to a conveyance chamber, a gate valve that hermetically seals and divides the processing chamber 100 and the conveyance chamber is closed.

Next, in a state where the electrode for the electrostatic chuck in the coating film on the upper surface of the sample stage 11 is supplied with direct current and the wafer is attracted onto the coating film on the sample stage 11, the process gas is supplied through the through-holes of the shower plate 3 into the processing chamber 100 while the operation of the vacuum pump evacuates the processing chamber 100. Balance between the flow rate of gas into the processing chamber 100 and the evacuation rate therefrom keeps the pressure in the processing chamber 100 within a predetermined decompressed range.

The high-frequency power supplied from the power introducer 105 into the processing chamber 100 excites the process gas in the processing chamber 100 to form plasma on and above the sample stage 11. The potential difference between the bias potential formed on and above the wafer by the power supplied from the high-frequency power source to the base member in the sample stage 11 and the plasma potential attracts charged particles in the plasma onto the wafer, thereby starting processing a film that is to be processed, and has a film structure having multiple film layers preliminarily vertically stacked on the upper surface of the wafer.

In this example, light emitted from byproducts formed in the processing chamber 100 during wafer processing and from excited particles in the plasma is received. Variation in characteristics of the light, such as intensity, is detected by a detector arranged outside of the processing chamber 100. The end point of the processing, the processing speed, or the density distribution and characteristics of plasma and the like are detected using the result of the detection. When detection of increase in the intensity of light having a specific wavelength emitted from the byproducts formed in the plasma during processing over the a threshold or reduction in the intensity, in turn, detects an approach to the end point of the process, supply of the high-frequency power to the base member is stopped according to an instruction signal transmitted from a controller of a plasma processing apparatus, not shown, the plasma is extinguished, supply of the process gas is stopped, and the wafer processing is stopped.

Subsequently, the electrostatic chuck of the wafer is released. The gate valve is opened. The wafer is passed from above the sample stage 11 to the distal end of the arm of the robot having entered the processing chamber 100. The wafer is conveyed from the processing chamber 100. If there is an unprocessed wafer to be processed next, the unprocessed wafer is subsequently conveyed into the processing chamber 100 by the operation of the arm of the robot, and the process is performed as described above. If there is no unprocessed wafer to be processed next, a controller determines that the process for a batch number of one lot of wafers has been completed, stops or pauses the operation in the plasma processing apparatus according to an instruction from the controller, or performs an operation of cleaning the inside.

In the plasma processing apparatus in this example, the multiple wafers are subjected to the multiple stages, and processed on a piece-by-piece basis in the processing chamber 100. Until the batch number of one lot of wafers are processed, the process is intermittently continued. Increase in the number of wafers to be processed, in turn, increases the time during which the inner wall of the processing chamber 100 is exposed to the plasma.

Accordingly, interaction between the inner wall of the processing chamber 100 and the plasma, for example, liberation of the surface material caused by attraction and collision of the charged particles, such as ions, in the plasma to and with the surface of the inner wall due to the potential difference between the surface of the inner wall and the plasma, and wear and deformation of the inner wall caused by volatilization of substances formed by chemical combination of the charged particles and excited atoms and molecules in the plasma with the material of the inner wall, or deposition formed by adherence of the byproducts formed in the processing chamber 100 during the processing to the surface of the inner wall vary the state of the surface of the inner wall. For example, investigation by the present inventors found out that the surface roughness increases with increase in accumulative time of exposure to the plasma during processing.

The members are made of the material of which the inner surface of the processing chamber 100 is made, the material that is provided in the processing chamber and the surface of which has a possibility of being exposed to a vacuum and plasma atmosphere. Particularly, in this embodiment, the members are of the top plate 2, the shower plate 3, the vacuum chamber wall 5, the baffles 9, and the sample stage 11. Among the members, some members may possibly cause a dangerous and fatal failure, such as an electric short circuit or breakage of vacuum, due to wear caused by the plasma.

Such members are required to be prevented from exposure to plasma as much as possible. A cylindrical shaped dielectric electrode cover 12 that covers the outer surface of the side wall on the sample stage 11 side, and a ring-shaped dielectric susceptor 8 that covers the outer peripheral edge of the upper surface of the sample stage 11 are provided on the side of the sample stage 11 to protect this stage from plasma and prevent this stage from being directly exposed to plasma. To protect the inner wall surface of the vacuum chamber wall 5 made of aluminum, stainless steel, or an alloy of these and to protect the surface from plasma and prevent the surface from being directly exposed to the plasma, a cylindrical liner 6 that has a surface made of dielectric or metal and covers the inner wall surface of the vacuum chamber wall 5 is provided on this surface.

The surfaces of the members that constitute the inner wall of the processing chamber 100, such as the shower plate 3 and the baffles 9 which are directly exposed to plasma, as well as the electrode cover 12, the susceptor 8, and the liner 6, which are adopted as the protection members, have the state of the surface roughness and the like varying with increase in cumulative time of wafer processing executed using plasma, as described above. In the case where the liner 6, the shower plate 3, the susceptor 8, and the electrode cover 12 are not adopted, the top plate 2, the vacuum chamber wall 5, the light-transmitting windows 7, and the sample stage 11 are directly exposed to the plasma. Consequently, wear and deformation due to the interaction with the plasma develop, and the surface state further varies greatly.

Such variation in the state of the surface of the inner wall causes increase in variation of the shape of the film structure formed on the surface of the wafer caused by the processing using the plasma from the predetermined shape. In order to reduce such variation, conventionally, techniques that adjusts the processing condition to an appropriate condition using APC, improves the accuracy of determining the end point or the like are performed. In order to achieve the film structure processing at a further high accuracy, which is demanded toward the future, improvement of the adjusting accuracy through APC is required. To meet this requirement, temporary varying plasma light emission itself, and variation in adverse effects by the surface of the inner wall are required to be detected at a higher accuracy.

In order to reduce unevenness in the shape resulting after processing in the wafer surface direction having a disc shape or a shape similar to an extent capable of being regarded as the disc, the processing chamber 100 of this embodiment has a disc shape and cylindrical shape arranged at a position having an axis coinciding with the central axis of the cylindrical-shaped processing chamber 100 so as to be symmetrical around this central axis, or at a position similar to an extent capable of being regarded as the coinciding case. Such a configuration can have the distributions of plasma, electric field, potential, and temperature on the wafer surface whose unevenness is reduced in the circumferential direction and around the axis, and reduce the processing unevenness in the directions within the wafer surface.

A configuration in the present embodiment for detecting variation in light emitted from the plasma and the surface of the inner wall is now described.

In this embodiment, the vacuum chamber wall 5 is provided with two through-holes at positions opposite to each other sandwiching the center of the processing chamber 100 at a height above the upper surface of the sample stage 11 and below the shower plate 3. Two light-transmitting windows 7 are further provided that are made of a light-transmitting material disposed so as to cover the openings in the walls on the outer peripheral side of these through-holes. In order to allow light having entered the processing chamber 100 from one light-transmitting window 7 to pass and radiated through the other light-transmitting window 7, a configuration is provided that allows the light to pass through the liner 6.

The liner 6 is made of a material, such as quartz or sapphire, that allows light to pass therethrough. Likewise, the light-transmitting window 7 is made of a material, such as quartz, that allows light to pass therethrough. In a state where the windows are mounted on the vacuum chamber wall 5 covering the through-holes, the outer peripheries on the surfaces nearer to the processing chamber 100, and the member of the vacuum chamber wall 5 sandwich the O-rings to deform these rings, thereby hermetically sealing the light-transmitting windows 7 separating the inside and the outside from each other by the O-rings.

A light receiving unit 101 arranged on the outside of the vacuum chamber wall 5 is attached and connected to the light-transmitting window 7 arranged on the one side (the left side of the vacuum chamber on the diagram) of this embodiment so as to cover this window. The light receiving unit 101 includes: a light receiving port 15 including a cylindrical-shaped member made of a light-transmitting material, such as quartz, for receiving light emitted from the inside of the processing chamber 100 through the light-transmitting window 7 to the outside; a collimator lens 14 that is arranged between the light receiving port 15 and the light-transmitting window 7, and collimates the light emitted from the light-transmitting window 7 into parallel light; and an optical path shield 13 that involves the collimator lens 14 to surround the outer periphery of the lens and blocks ambient light from illumination and the like.

A radiation unit 102 arranged on the outside of the vacuum chamber wall 5 is attached and connected to the light-transmitting window 7 arranged on the other side (the right side of the vacuum chamber on the diagram) so as to cover this window. As with the light receiving unit 101, the radiation unit 102 includes: a radiator port 16 including a cylindrical-shaped member made of a light-transmitting material, such as quartz, for radiating light to enter the inside of the processing chamber 100 through the light-transmitting window 7 on the one side; a collimator lens 14 that is arranged between the radiator port 16 and the light-transmitting window 7, and collimates the incident light into parallel light; and an optical path shield 13 that involves the collimator lens 14 to surround the outer periphery of the lens and blocks ambient light from illumination and the like.

In the case of adopting a light-transmitting material as that of the top plate 2 or the shower plate 3, entrance of surrounding ambient light into the light receiving unit 101 and the radiation unit 102 is required to be reduced. To meet this requirement, in this embodiment, a shield 1 is disposed that is a member made of light blocking plastic, or a member coated with paint having a small light-transmittance, such as black paint, or a member made black-colored alumite-treated metal, which is arranged above the upper end of the cylindrical portion of the vacuum chamber wall 5 to cover the entire top plate 2.

Alternatively, adoption of material, such as metal, that does not allow light to pass as the vacuum chamber wall 5 can also reduce entrance of surrounding ambient light into the light receiving unit 101 and the radiation unit 102. In the case of adopting light-transmitting material as the vacuum chamber wall 5, a member for blocking light, which is similar to the shield 1, is arranged over the outer periphery of the vacuum chamber wall.

A splitter 19 is arranged between the radiator port 16 and the external light source 21 that emits light to be emitted from the radiator port 16. The splitter 19 branches the light from the external light source 21 into paths in the multiple directions. The splitter 19 is arranged and sealed in the splitter holder 20, which is a container accommodating the splitter 19. Ports for receiving and emitting light are arranged at four positions on the container wall of the splitter holder 20, these positions being opposite to each other sandwiching the surface of the plate-shaped splitter 19.

Light emitted from an external light entrance port, which is one of these ports, into the inside of the splitter holder 20 passes through the splitter 19, and is transmitted through the ports in the three directions along different paths. The configuration of the splitter 19 reduces entrance of the surrounding ambient light into the splitter 19 and each port of the splitter holder 20.

The external light output from an external light source port 22 provided in the external light source 21 is branched into two directions by the splitter 19 in the splitter holder 20. One branched component of light is output as reference external light from a reference light port 17, which is one of the four ports. The other branched component of the light passes through the external reference light port, which is one of the ports of the splitter holder 20, is transmitted to the radiator port 16 of the radiation unit 102, output therefrom, passes through the processing chamber 100 and the light-transmitting window 7 and the liner 6 as parallel light, and received by the light receiving port 15 of the light receiving unit 101 as inner-wall-transmitting external light.

According to such a configuration, reflected light is caused on the surface of each of members through which the external light generated by the external light source 21 passes from the radiator port 16 to the light receiving port 15. The reflected light passes through the radiation unit 102 to the radiator port 16 and then reaches the splitter 19, and hereby branched, one of the branched components is output to the outside as inner-wall-reflected external light through a reflection port 18 arranged at the container of the splitter holder 20. The surfaces of the light-transmitting window 7 and the collimator lens 14, except for the liner 6, are provided with a coating film for preventing reflection, which can highly accurately obtain the reflected light that reflects variation in the surface of the inner wall.

Light emitted from plasma passes through the liner 6, the light-transmitting windows 7, and the collimator lenses 14, and enters the light receiving port 15 and the radiator port 16 on the sides of the light receiving unit 101 and the radiation unit, respectively, as the light emitted from the plasma. In this embodiment, light emitted from the reference light port 17, the light receiving port 15, and the reflection port 18 passes through the respective paths, and enters a spectroscope port 24 and then enter the spectroscope 23. A spectrum calculator 28 detects spectral data items on the respective components of the light based on these components of light.

The external light source port 22 is connected to the external light entrance port of the splitter holder 20, the external reference light port of the splitter holder 20 is connected to the radiator port 16, the reference light port 17 is connected to the spectroscope port 24, and the reflection port 18 is connected to the spectroscope port 24; these connections are established through the optical fibers 25 which serves as an optical path having fiber connectors 26 at the opposite ends and in which light is transmitted. Between the light receiving port 15 and the spectroscope port 24, there are arranged optical fibers that connect these ports, and include optical fibers constituting an optical path coupled to the reference light port 17, and branched fibers 27 coupled to optical fibers constituting an optical path coupled to the reflection port 18. Light having been transmitted through the three optical paths is bound together and transmitted to the spectroscope 23 through the spectroscope port 24.

Furthermore, shutters 27a to 27e are provided between the four ports of the splitter holder 20 and ports to which these ports are connected and between the light receiving port 15 and the spectroscope port 24. Opening and closing these shutters 27a to 27e can switch between blocking and connecting the optical path according to a request by a user. Combination of the opening and closing operations of the shutters 27a to 27e connects the ports to each other, and can detect, as a target, the light transmitted on the optical path constituted by the connection of the ports. FIG. 2 shows such combinations. FIG. 2 is a table showing an open and close combination of a shutter, and light to be measured on an optical path selected for each combination in the embodiment shown in FIG. 1. As shown in this table, appropriate setting of the opening and closing the shutter can detect different types of light as a measurement target using the spectroscope 23.

As described above, each optical path of this embodiment is provided with the members so as not to allow the surrounding ambient light to enter these paths. The members cover the optical paths to shield the paths against the surroundings, as with the shutters 27a to 27e, or are subjected to reflection preventing process so as to prevent at least the surrounding ambient light from directly entering into the optical path.

The light transmitted to the spectroscope 23 through each optical path is separated into spectral components. The spectral data is calculated by the spectrum calculator 28 as OES data, which is stored and recorded by a database creator 29 in a database in a storage device, not shown, connected to the database creator 29 via wireless or wired communication means. Furthermore, the database stores data on the state of plasma including the detected density and intensity of discharge and energy distribution of the plasma, data on the dimensions of the film structure on a processed wafer to be obtained by another instrument for detection after processing, and data representing the correlation between these dimensions and the data on the state of plasma. A plasma condition controller 30 detects the state of the plasma, such as a distribution of quantities related to particles in the plasma, using the data in the database held in the storage device, such as a hard disk or RAM including a semiconductor device, read through the communication means, and calculates a processing condition for obtaining a desired processing result according to the quantity of the state.

The signal of data representing the condition is transmitted via the communication means to the controller of the plasma processing apparatus, not shown. The controller detects the condition from the received signal, and adjusts the operation of the plasma processing apparatus according to the signal, thus executing APC.

Next, the configuration component of the plasma processing apparatus according to this embodiment for detecting the OES data is described.

As described above, in the processing chamber 100, the members configuring the inner wall of the processing chamber 100 are arranged so as to be symmetrical around the central axis. Furthermore, the configuration components of the light receiving unit 101 and the radiation unit 102 for detecting light emitted from plasma are provided with the light-transmitting windows 7, the collimator lenses 14, optical path shields 13, and the light receiving port 15 and the radiator port 16, at positions opposite to each other sandwiching the liner 6.

According to such configuration components, a light-receiving-side inner wall surface 103 having an area of a portion where light having passed through the liner 6 and been incident on the light receiving unit 101 passes through the inner wall surface of the liner 6, and a radiation-side inner wall surface 104 having an area of a portion where light radiated from the radiation unit 102 into the processing chamber 100 passes through the inner wall of the liner 6 are the same as each other, or have similar values, which can be regarded as the same. These surfaces are arranged at positions symmetrical sandwiching the central axis of the processing chamber 100 (opposite to each other apart by 180 degrees), the positions in the height (vertical) direction are the same as each other or similar to an extent capable of being regarded as the same. Consequently, in this embodiment, the positions and areas on the surface of the inner wall where the external light and the plasma light pass are configured to substantially coincide with each other.

Furthermore, this embodiment includes a configuration according to which change in the focal length of the collimator lens 14 or in positional relationships between the collimator lenses 14 and the light receiving port 15 and radiator port 16, and use of multiple lenses for collimating increases or decreases the sectional areas of optical paths for light that is radiated from the radiator port 16, passes through the light-transmitting window 7 and the liner 6 and is introduced in parallel into the processing chamber 100, and for parallel light that is from the processing chamber 100, passes through the liner 6 and the light-transmitting window 7 and is incident on the collimator lens 14 of the light receiving unit 101. Thus, the areas of the light-receiving-side inner wall surface 103 and the radiation-side inner wall surface 104 can be changed.

For the sake of reducing adverse effects on detection of the light due to variation in shapes and physical properties, such as surface roughness, of the inner wall of the liner 6 caused by increase in cumulative time of wafer processing, the light-receiving-side inner wall surface 103 and the radiation-side inner wall surface 104 are required to have a diameter of at least 1 mm. For the sake of improving the intensity of light and the detection accuracy by increasing the area by increasing the amount of light from plasma and an area allowing light from the outside to pass as much as possible, the areas of the light-receiving-side inner wall surface 103 and the radiation-side inner wall surface 104 are desired to have a diameter of at least 5 mm, and furthermore, desired to have a diameter of at least 10 mm.

Note that, for the sake of preventing leakage of power to be supplied from the power introducer 105 to form plasma and of high-frequency power to be supplied to the base member in the sample stage 11, sites where such powers are supplied, or the diameters of the openings exposed to the electric field, for example, the light-receiving-side inner wall surface 103 and the radiation-side inner wall surface 104, the through-holes and light-transmitting windows 7 for light radiation and reception in the vacuum chamber wall 5 are required to have a wavelength of at least ½ or lower of that of the high frequency (electromagnetic waves) used as a power source. For example, in the case of using 2.45 GHz microwaves as the electric field for forming plasma, the openings are required to have a diameter of approximately 60 mm or less.

In this example, in order to prevent light collimated into parallel light by the collimator lens 14 from entering the light receiving unit 101 from the processing chamber 100, or being reflected by the wall surface of the vacuum chamber wall 5 during introduction from the radiation unit 102 into the processing chamber 100, the optical path of the parallel light is configured to have a sectional area smaller than the diameter of the opening of the vacuum chamber wall 5 does.

Next, the configuration of obtaining data on the light from the plasma, and data affected by the surface of the inner wall, from the light received by the light receiving unit 101 and introduced into the spectroscope 23 in this embodiment is described. As shown in FIG. 2, in this embodiment, combination of the opening and closing states of the shutters 27a to 27e selects each of the multiple optical paths. Light having passed through the selected path is received at the light receiving unit 101 or the spectroscope port 24, and information can be detected by the spectroscope 23 using the received light.

In the present embodiment, the amounts of light (radiant flux, which is per unit time) on the respective optical paths selected for detection are referred to as reference external light $I_o$, inner-wall-transmitting external light $I_t$, light-receptor-side plasma light $P_{m1}$, inner-wall-1 reflected external light $I_r$, and radiation unit-side plasma light $P_{m2}$. The light-receptor-side plasma light $P_{m1}$ is an amount of light detected from the spectrum of light from the plasma in the processing chamber 100 (via the film and deposit on the surface of the liner 6, if any) having passed through the light-receiving-side inner wall surface 103 and the inside of the liner 6, entered the light receiving unit 101, been transmitted from the light receiving port 15 connected to the light receiving unit 101, through the shutter 27e, the branched fibers 27, and the spectroscope port 24, to the spectroscope 23. The radiation unit-side plasma light $P_{m2}$ is an amount of light detected from the spectrum of light from the plasma in the processing chamber 100 (via the film and deposit on the surface of the liner 6, if any) having passed through the light-receiving-side inner wall surface 103 and the inside of the liner 6, entered the radiation unit 102, been emitted from the radiator port 16, reflected by the splitter 19, been emitted from the reflection port 18 through the shutter 27c, passed through the optical path in the optical fibers out of the vacuum chamber wall 5, and been transmitted through the branched fibers 27 and the spectroscope port 24 to the spectroscope 23.

It is assumed that the values of ratios of components of light passing through and reflected by the splitter 19 to the amounts of light incident on the splitter 19, which have been preliminarily known based on the specifications including physical properties of the material, are St and Sr. These constants according to the specifications of the plasma processing apparatus, and the detected $I_o$, $I_t$, $I_r$, $P_{m1}$ and $P_{m2}$ are stored as information in the controller, not shown, for adjusting the operation of the plasma processing apparatus of this embodiment, or RAM arranged in the plasma condition controller 30 included therein, or a communicatively connected storage device, such as an external HDD. Through use of the values St and Sr of ratios of transmission and reflection at the splitter 19 and the amount of light $I_0$, the amount of light $I_{in}$ radiated into the processing chamber from the radiator port 16 is calculated by the calculator in the controller according to an algorithm described in predetermined software using Equation (11).

$$I_{in} = I_0 \frac{S_r}{S_t} \tag{1.1}$$

It is further assumed that the amount of lights entering the light-receiving-side inner wall surface 103 and the radiation-side inner wall surface 104 from the plasma formed in the processing chamber 100 are $P_1$ and $P_2$, respectively. The transmittances of light at the surface of the inner wall of the liner 6 including the light-receiving-side inner wall surface 103 and the radiation-side inner wall surface 104 on a side nearer to the light receiving unit and on a side nearer to the radiation unit are assumed as $t_1$ and $t_2$, respectively. The inner-wall-transmitting external light $I_t$ measured in the state where no plasma is formed is preliminarily given according to Equation (1.2).

$$I_t = I_{in} t_1 t_2 \tag{1.2}$$

Meanwhile, the respective relationships between the plasma light $P_1$ and plasma light $P_2$ and the light-receptor-side plasma light $P_{in1}$ and the radiator-side plasma light $P_{m2}$ are obtained according to Equations (1.3) and (1.4).

$$P_{m1} = P_{in1} \tag{1.3}$$

$$P_{m2} = P_2 t_2 s_r \tag{1.4}$$

As described above, for the sake of reducing unevenness in the processed shape, which is a processing result in the directions in the wafer surface, the distributions of the density and intensity of plasma are desired to be configured to be close to distributions that are more even and axial symmetry. In the case where the evenness is achieved, $t_1 = t_2$ in Equation (1.2), $I_{in}$ is detected from Equation (1.1), and $t_1$ and $t_2$ can be calculated using the values of measured light $I_o$ and $I_t$, and the split ratios St and Sr. In consideration of the result of detecting the light on the optical path, according to confirmation of $P_{n1} = P_{m2}/Sr$, it can be determined whether $t_1 = t_2$ is satisfied or not, that is, whether the surface states of the light receiving unit side inner wall and the radiation unit side inner wall are identical to each other or not.

Meanwhile, allowances, which are within several nanometers, are defined for the processing variation within the same wafer surface, and the processing variation among mass-produced wafers. Consequently, the processing dimensions within the wafer surface sometimes include variation that does not exceed the allowance. A bias of the plasma distribution is thus allowed even though the allowance is very small. In this case, $t_1 \neq t_2$, $P_{m1} \neq P_{m2}/Sr$ and $P_1 \neq P_2$.

Based on the above equations and the detected amount of light and the values of constants, $P_1$ and $P_2$, which are the amounts of light incident from the plasma toward the light receiving unit 101 and the radiation unit 102 arranged at the sites opposite to each other sandwiching the center of the processing chamber 100, are related to each other. However, these values are not uniquely determined.

In this embodiment, through use of the result of detecting $P_{m1}$ and $P_{m2}$, the inner wall transmittance and the amount of light from the plasma can be obtained as the geometric mean values of the values of amounts of light on the light receiving unit side inner wall and the radiation unit side inner wall. The geometric mean $t_g$ of transmittance is represented by Equation (1.5) from Equations (1.1) and (1.2).

$$t_g = \sqrt{t_1 t_2} = \sqrt{\frac{I_t S_t}{I_0 S_r}} \quad (1.5)$$

The geometric mean P of the amounts of light from the plasma is represented by Equation (1.6) from Equations (1.3) to (1.5).

$$P_g = \sqrt{P_1 P_2} = \sqrt{\frac{P_{m1} P_{m2}}{t_1 t_2 S_r}} = \sqrt{\frac{I_0 P_{m1} P_{m2}}{I_t S_t}} \quad (1.6)$$

Thus, from the detected amounts of light I, I, P and P on the respective optical paths, and the ratios Sr and St of reflection and transmission of light at the splitter 19, t and P can be calculated. In this embodiment, even in the case where the distribution of plasma is uneven, highly accurate OES data on the plasma light can be detected using these values, and the variation in processed shape, which is a processing result, can be calculated using these.

Furthermore, the variation value or variation ratio of the geometric mean P of light emission and the geometric mean t of transmittance of light from the plasma according to the cumulative number of processed wafers and increase in cumulative processing time in the processing chamber 100 after the initial state or immediately after cleaning can be used to determine timing when the operation of processing wafers in the processing chamber 100 is stopped and then changes the operation to cleaning, maintenance, and inspection. More specifically, when compared to what is detected during wafer processing in the initial state or started after in a state where the surface of the inner wall of the processing chamber 100 after cleaning becomes clean close to that of the initial state, the variation ratios of P or t are determined to be 10% or higher, it is desired to at least temporarily stop the operation of the plasma processing apparatus for manufacturing semiconductor devices after completion of processing wafer currently under processing in the processing chamber 100, for the sake of maintenance and inspection.

In the case where variation in the dimensions of the film structure on the upper surface of a wafer as a processing result is required to be reduced to be smaller, it is desired to stop the wafer processing operation when the variation ratios are judged to become 5% or higher. In the case where the processing variation is required to be further reduced, the permissible ranges of the variation ratio of these parameters are desired to be set to 3%. After the operation of manufacturing semiconductor devices is stopped, cleaning, inspection, replacement and the like of the parts that are disposed in the processing chamber 100 and constitute the inner surface of this chamber are performed.

The plasma processing apparatus using inductively coupled plasma, such as ICP and TCP, sometimes has a biased plasma distribution dependent on the presence of a terminal end of an induction coil and the coil shape. The configuration of this embodiment can efficiently reduce variation in the dimensions after processing as a result of wafer processing.

A method of obtaining the values $t_1$ and $t_2$ of data on inner wall surface and data on plasma light emission, in a condition where the reaction between inner wall surface of the processing chamber 100 and plasma is sufficiently small, and the variation in plasma relative to the variation in the state of inner wall surface is small, is hereinafter described. As to the processing chamber 100 in the initial state or after completion of maintenance and before start of the wafer processing, in the case of irradiating the inside of the processing chamber 100 with reference light from the outside, the amount of light and the transmittance of the members through which the light passes are referred to as reference external light $I_{00}$, inner-wall-transmitting external light $I_{t0}$, light $I_{in0}$ emitted to the processing chamber, the transmittance $t_{10}$ of light receiving unit side inner wall, the transmittance $t_{20}$ of the radiation unit side inner wall, and the geometric mean $t_{g0}$ of the transmittance.

Furthermore, in this example, the amount of plasma light emission and the transmittances of the members constituting the inner wall due to variation in the amount and quality of accretion adhering to the surface of the inner wall of the processing chamber 100 during sequential processing of multiple wafers are detected using the amount of light and transmittance from determined plasma, which is formed in the processing chamber 100 as a reference. In the initial state, or after completion of maintenance and before start of wafer processing, the amount of light and transmittance from plasma, which is a reference, are hereinafter referred to as light-receptor-side plasma light $P_{m10\_sp}$, radiator-side plasma light $P_{m20\_sp}$, geometric mean $P_{g0\_sp}$ of plasma light, light receiving unit side transmittance $t_{10\_sp}$, radiation unit side transmittance $t_{20\_sp}$, and geometric mean $t_{g0\_sp}$ of transmittance.

As with $P_{m1}$ and $P_{m2}$, the light-receptor-side plasma light $P_{m10\_sp}$ and $P_{m20\_sp}$ are an amount of light detected from the spectrum of light from the plasma as a reference in the processing chamber 100 (via the film and deposit on the surface of the liner 6, if any) having passed through the light-receiving-side inner wall surface 103 and the inside of the liner 6, entered the light receiving unit 101, been transmitted from the light receiving port 15 connected to the light receiving unit 101, through the shutter 27e, the branched fibers 27, and the spectroscope port 24, to the spectroscope 23, and an amount of light detected from the spectrum of light from the plasma as a reference in the processing chamber 100 (via the film and deposit on the surface of the liner 6, if any) having passed through the light-receiving-side inner wall surface 103 and the inside of the liner 6, entered the radiation unit 102, been emitted from the radiator port 16, reflected by the splitter 19, been emitted from the reflection port 18 through the shutter 27c, passed through the optical path in the optical fibers out of the vacuum chamber wall 5, and been transmitted through the branched fibers 27 and the spectroscope port 24 to the) spectroscope 23. Furthermore, in the initial state, or after completion of maintenance and before start of wafer processing, the plasma light entering the light-receiving-side inner wall surface 103 and the radiation-side inner wall surface 104 and serving as a reference are referred to as $P_{10\_sp}$ and $P_{20\_sp}$, respectively.

The plasma and the plasma light which serve as references in the present example are referred to as reference plasma and reference plasma light. As the reference plasma, plasma whose chemical reaction with the surface of the inner wall and film formation to the surface due to accretion onto the inner wall are sufficiently small is desirable. It is further desirable that the adverse effect due to variation in the state of the inner wall surface caused during sequential plasma processing of multiple wafers is sufficiently small, and, even if the number of processed wafers and the cumulative value of time increase, the distribution of intensity and distribution of plasma, and variation in plasma characteristics, such as intensity of plasma light emission is sufficiently small.

In this example, the plasma adopting rare gas may be used as reference plasma. In the case of adopting quartz or sapphire as the materials of which the members constituting the surface of the inner wall are made, plasma adopting oxygen or nitrogen gas having sufficiently low reaction with such materials can be used.

In this example, the amount and transmittance of light from the reference plasma detected during the operation for manufacturing devices are referred to as light-receptor-side plasma light $P_{m1\_sp}$, radiator-side plasma light $P_{m2\_sp}$, geometric mean $P_{g\_sp}$ of plasma light, light receiving unit side transmittance $t_{1\_sp}$, radiation unit side transmittance $t_{2\_sp}$, and geometric mean $t_{g\_sp}$ of transmittance. These amounts of light are detected during the operation for manufacturing devices, through the same optical paths as those of $P_{m10\_sp}$, $P_{m20\_sp}$ and the like in the initial state, or after completion of maintenance and before start of wafer processing. During the operation for manufacturing devices, the amounts of light emitted from plasma and entering the light-receiving-side inner wall surface 103 and the radiation-side inner wall surface 104 are referred to as $P_{1\_sp}$ and $P_{2\_sp}$.

The relationships between the amounts of light formed and emitted from the reference plasma, and entering two sides opposite to each other sandwiching the central axis of the processing chamber 100 in the state where the surface of the inner wall of the processing chamber 100 can be regarded clean in the initial state or after cleaning, and light detected through the light receiving unit 101 and the radiation unit 102 arranged on the respective sides, and the transmittance on the inner wall surface of the liner 6 are obtained as Equations (1.3a) and (1.4a) from Equations (1.3) and (1.4).

$$P_{m10\_sp}=P_{10\_sp}t_{10\_sp} \tag{1.3a}$$

$$P_{m20\_sp}=P_{20\_sp}t_{20\_sp}s_r \tag{1.4a}$$

In this example, the transmittances $t_{10\_sp}$ and $t_{20\_sp}$ of the surfaces of the members constituting the inner wall of the liner 6 before disposition in the processing chamber 100 or before start of processing a first wafer in the operation for manufacturing devices are preliminarily measured and detected. Through use of the result, the amounts of light $P_{10\_sp}$ and $P_{20\_sp}$ from the reference plasma entering the light-receiving-side inner wall surface 103 and the radiation-side inner wall surface 104 in the initial state, or after completion of maintenance and before start of wafer processing are detected.

In order to detect the transmittances $P_{10\_sp}$ and $P_{20\_sp}$, members disposed on the optical system and the path ranging from the radiation unit 102 to the light receiving unit 101, the external light source 21, and the like in the embodiment in FIG. 1 may be adopted. The light receiving unit 101, or the light receiving unit 101 and the transmitting windows are disposed in a space in the inner wall of the processing chamber 100 or in the liner 6, and so as to be opposite to the radiation unit 102, thereby allowing the transmittance $t_{10\_sp}$ to be detected. The transmittance $t_{20\_sp}$ can be detected in an arrangement where the positions of the radiation unit 102 and the light receiving unit 101 are replaced with each other, or the liner 6 is disposed at a position turned from the position of detecting $t_{10\_sp}$ by 180°.

During the maintenance period of the plasma processing apparatus, the detection may be performed in a state where the liner 6 is arranged in the processing chamber 100. In this example, the values of transmittances $t_{10}$ and $t_{20}$ obtained from detection with external light irradiation can be regarded as the transmittances $t_{10\_sp}$ and $t_{20\_sp}$, and the amounts of light, which will be described below, are detected. Alternatively, the spectrum of the transmittances $t_{10\_sp}$ and $t_{20\_sp}$ may be obtained by numerical calculation using the result of detection of the shape of the surface of the inner wall of the liner 6 through a displacement meter or the like.

As with the above description, the values of the amounts of detected light and the transmittances are stored as information in the controller, not shown, for adjusting the operation of the plasma processing apparatus of this embodiment, or RAM arranged in the plasma condition controller 30 included therein, or a communicatively connected storage device, such as an external HDD Before start of the wafer processing in the operation for manufacturing devices using the values of the transmittances thus detected, the geometric mean $t_{g0\_sp}$ of the transmittances of the light receiving unit side inner wall and the radiation unit side inner wall of the liner 6 for the light from the reference plasma formed in the processing chamber 100 is represented by Equation (1.5a).

$$t_{g0\_sp}=\sqrt{t_{10\_sp}t_{20\_sp}} \tag{1.5a}$$

Before start of the processing, the relationship between the amount of light from the external light source 21 and the transmittance of the inner wall of the processing chamber 100 in the liner 6 is represented as Equation (1.5b) using Equations (1.1), (1.2) and (1.5).

$$t_{g0}=\sqrt{t_{10}t_{20}}=\sqrt{\frac{I_{l0}S_r}{I_{00}S_t}} \tag{1.5b}$$

Through use of equality of the geometric means of the transmittances of Equations (1.5a) and (1.5b), both the means are compared with each other and it can be determined whether the accuracies of the values of the previously detected transmittances $t_{10\_sp}$ and $t_{20\_sp}$ are within permissible ranges or not. Preliminarily detected $t_{20}$ is compared with $t_{20}$ calculated according to Equation (1.5b) using preliminarily detected $t_{10}$, $I_{00}$, $I_{r0}$, Sr and St, and it can be determined whether the detection accuracy is within the permissible range or not.

The relationship between the amount of light from the reference plasma and the transmittance of the inner wall of the processing chamber 100 after the operation for manufacturing devices is started and the processing of a first wafer is started is obtained as Equations (1.3A) and (1.4A) from Equations (1.3) and (1.4).

$$P_{m1\_sp} = P_{t\_sp} t_{1\_sp} \qquad (1.3A)$$

$$P_{m2\_sp} = P_{2\_sp} t_{2\_sp} s_r \qquad (1.4A)$$

If the variation in the amount of light from the reference plasma relative to the variation in the transmittance of the inner wall surface in the processing chamber 100 during the operation for device manufacturing is sufficiently small, Equations (2.1) and (2.2) can be regarded to be satisfied.

$$P_{10\_sp} = P_{1\_sp} \qquad (2.1)$$

$$P_{20\_sp} = P_{2\_sp} \qquad (2.2)$$

In this case, the transmittance $t_{1\_sp}$ of the inner wall surface of the processing chamber 100 of the liner 6 on the side nearer to the light receiving unit 101, and transmittance $t_{2\_sp}$ on the radiation unit 102 during the operation for device manufacturing are calculated by the calculator in the controller on the basis of a predetermined algorithm from Equations (1.3A), (1.4A), (2.1) and (2.2), using the ratio of the amounts of light of the reference plasma entering the light receiving unit 101 and the radiation unit 102 in the initial state of the surface of the inner wall of the liner 6 or after the maintenance operation before start of wafer processing, in a state where cleaning is performed during maintenance and a state where the inner wall surface can be regarded as a clean state similar to the initial state to the amount of light detected through the radiation unit 102 and the light receiving unit 101 after start of wafer processing in the operation for device manufacturing.

Through use of these detected transmittances $t_{1\_sp}$ and $t_{2\_sp}$ and Equations (1.3) and (1.4), from Equations (2.3) and (2.4), $P_1$ and $P_2$ which are the amounts of light from the plasma entering the side of light receiving unit 101 and the side of radiation unit 102 in processing any wafer during the operation of device manufacturing are calculated.

$$P_1 = \frac{P_{m1}}{t_{1\_sp}} \qquad (2.3)$$

$$P_2 = \frac{P_{m2}}{t_{2\_sp}} \qquad (2.4)$$

In this example, it is important that the variation in the amount of light from the reference plasma is sufficiently small during, before and after the of device manufacturing operation. This can be confirmed by determining whether the size of the difference between the geometric means $t_g$ and $t_{g\_sp}$ is within the permissible range or not; the geometric mean $t_g$ is of the transmittances on the light receiving unit side and the radiation side of the inner wall surface of the processing chamber 100 in the liner 6 in the case of using the light from the external light source 21 during the device manufacturing operation obtained from Equation (1.5), and the geometric mean $t_{g\_sp}$ is of the transmittances on the inner wall surface for the light from the reference plasma formed in the processing chamber 100 during the operation.

From Equation (1.5), the geometric mean $t_{g\_sp}$ of the transmittances can be obtained according to Equation (1.5A)

$$t_{g\_sp} = \sqrt{t_{1\_sp} t_{2\_sp}} \qquad (1.5A)$$

Typically, a period for maintenance of the plasma processing apparatus during which the inner wall surface of the processing chamber 100 is cleaned, and a period for the operation for manufacturing devices are alternately and repeatedly performed. Thus, the values of the amounts and transmittances of light in the operation for manufacturing devices or after cleaning in maintenance and before start of wafer processing in the operation for manufacturing devices are stored, for example, recorded in a storage device, such as RAM or HDD, arranged in the controller, not shown, information on the amounts of light $P_{10\_sp}$, $P_{20\_sp}$ and $P_{1\_sp}$ and $P_{2\_sp}$ from the reference plasma can be obtained from the values of the amounts of light and the transmittances detected after the cleaning performed before the start or during the operation for device manufacturing, in the operation for manufacturing any device.

In this case, unlike the above description, the transmittances $t_{10\_sp}$ and $t_{20\_sp}$ on the inner wall surface of the liner 6 are not necessarily detected before the start of processing of wafers for device manufacturing, but $t_{10\_sp}$ and $t_{20\_sp}$ can be detected according to Equations (1.3a) and (1.4a). Furthermore, through use of Equations (1.5a) and (1.5b), it can be confirmed that the detected transmittances $t_{10\_sp}$ and $t_{20\_sp}$ are correct. Moreover, through use of Equations (1.3A), (1.4A) and (2.1) to (2.4), the transmittances $t_{1\_sp}$ and $t_{2\_sp}$, and the amounts of light $P_1$ and $P_2$ from the plasma during wafer processing can be obtained.

Thus, through use of the detected amount of light from the reference plasma and the values of the transmittance of the inner wall surface of the processing chamber 100 after start of wafer processing in the initial state of inner wall surface of the processing chamber 100 or a state where the surface is clean so as to be regarded as that in the initial state, and amount of light from the plasma during the processing of wafers in the operation for device manufacturing, the amounts of light from the plasma on the side of the light receiving unit 101 and the side of the radiation unit 102 arranged at the position opposite to the position of the light receiving unit side during the wafer processing are highly accurately detected. According to this configuration, even when the distribution of plasma formed in the processing chamber 100 during wafer processing is biased, OES data on the amounts of light $P_1$ and $P_2$ from the plasma can be highly accurately obtained. Furthermore, through use of the data, the variation in the dimensions of the shape where the film structure of the wafer surface having been subjected to the etching process can be highly accurately evaluated, and the condition for forming plasma in the processing chamber 100 and processing a wafer can be appropriately adjusted, thereby allowing the processing to be improved in yield.

As described using Equations (1.1) to (1.6), through use of the geometric mean $P_g$ of the amounts of light $P_1$ and $P_2$ from the plasma obtained using the reference external light $I_0$, which is the amount of light from the external light source 21, the OES data related to the light from the plasma can be highly accurately obtained even in the case where the intensity and density of plasma are biased in the radial and circumferential directions of the processing chamber 100 or the wafer. However, in this case, the difference between $P_g$ and $P_1$ or $P_2$ increases with increase in bias of the plasma.

When the bias of plasma varies such that $P_1$ increases and $P_2$ decreases, or $P_2$ increases and $P_1$ decreases, the geometric mean $P_g$ of $P_1$ and $P_2$ is unchanged but $P_1$ or $P_2$ is changed in some cases. In the case of using the light from the reference plasma, each of $P_1$ and $P_2$ can be detected. Consequently, even when $P_g$ is unchanged but $P_1$ or $P_2$ is changed, the variation in the characteristics, such as the intensity and density, of the plasma can be detected, and the OES data on the light from the plasma can be higher accurately obtained, the conditions for wafer processing through plasma using the data can be adjusted to reduce the variation of the distribution of the processed shape from the initial one.

Furthermore, the amounts of light $P_1$ and $P_2$ from the plasma due to increase in the time of operation of the wafer processing and in the number of processed wafers, the magnitude of variation in the transmittance $t_1$ and $t_2$, and the variation ratio are detected, and stop of the operation can be determined on the basis of the detection. Alternatively, the stop of the operation may be determined using the difference or ratio between $P_1$ and $P_2$ or between $t_1$ and $t_2$. As described above, a specific reference for determination may be selected to be 10%, 5% or 3% of the variation in the difference or the ratio between $P_1$, $P_2$, $t_1$, $t_2$ and $P_1$, and $P_2$, $t_1$ and $t_2$, according to the required range of reduction in processing variation.

In the above embodiment, the case has been described where the distributions of the reference plasma formed in the processing chamber 100 and the plasma formed in wafer processing of device manufacturing operation are biased. It is a matter of course that, even in the case where the parameters representing the characteristics, such as the density or intensity, of the plasma are sufficiently small in the radial or circumferential directions of the processing chamber 100 or the wafer, each amount and transmittance of light can be detected by a similar method.

Figure 3:
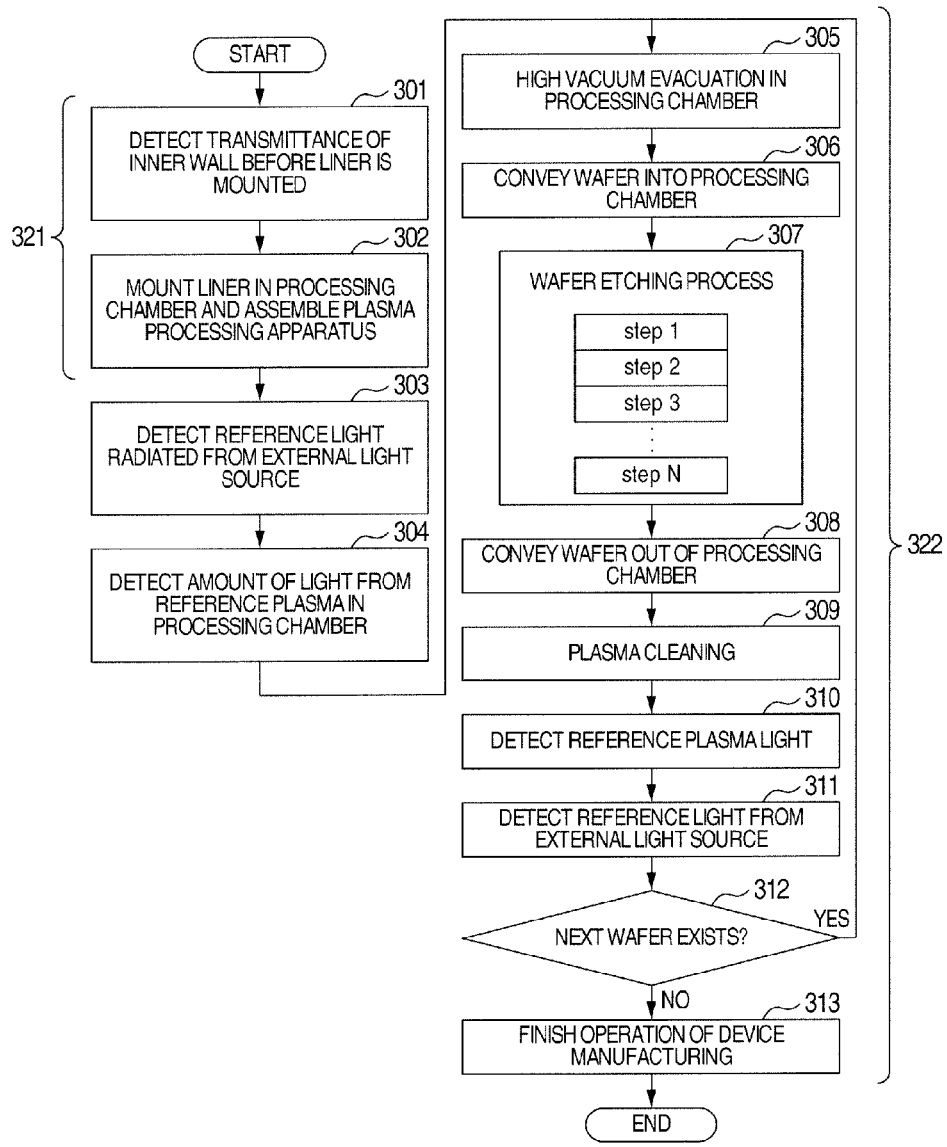
FIG. 3 is a flowchart showing a flow of operation of the plasma processing apparatus according to the embodiment shown in FIG. 1.

Next, referring to FIG. 3, the operating details of the plasma processing apparatus according to the present embodiment during operation are described. FIG. 3 is a flowchart showing a flow of the operation of the plasma processing apparatus according to the embodiment shown in FIG. 1.

As described above, in this embodiment, the transmittances $t_{10\_sp}$ and $t_{20\_sp}$ of the surface of the inner wall of the liner 6 taken out of the processing chamber 100 to allow the surface of the inner wall to be cleaned to achieve certain cleanness in a period during which an operation of maintenance stage 321 is performed in the plasma processing apparatus are detected (step 301). At this time, the configuration for detecting the reference light from the external light source 21 or the like shown in FIG. 1, and the light from the plasma may be used.

Next, after the transmittance in step 301 is detected and the value thereof is stored in the storage device, such as RAM or HDD, arranged in the controller, not shown, and then the maintenance is finished after assembling of the plasma processing apparatus including mounting of the liner 6 in the processing chamber 100, and the operation, such as checking of leakage of vacuum evacuation in the processing chamber 100 are performed (step 302). Subsequently, a predetermined amount of light is emitted from the external light source 21, the optical path including the optical fibers is selected according the operation of selectively opening and closing the shutter 27a to 27d shown in FIG. 2, and each of the amounts of light of the reference external light $I_{00}$, and the inner-wall-transmitting external light $I_{r0}$ is detected (step 303). Through use of the values of ratios St and Sr between the transmission light and reflected light determined based on detected $I_{00}$ and $I_{r0}$ and the specifications of the splitter 19, the amount of light radiated into the processing chamber 100 from the radiator port 16 is calculated by the calculator arranged in the controller.

Furthermore, rare gas is introduced into the processing chamber 100, and the reference plasma is formed. Based on the light from the reference plasma, the amounts of light $P_{m10\_sp}$ and $P_{m20\_sp}$ are detected (step 304). Based on the detected data on $P_{m10\_sp}$ and $P_{m20\_sp}$, the geometric mean $P_{g0\_sp}$, and the amounts of light $P_{10\_sp}$ and $P_{20\_sp}$ from the reference plasma and incident on the light-receiving-side inner wall surface 103 and the radiation-side inner wall surface 104 of the liner 6 are calculated by the calculator in the controller. The detected or calculated amounts of light, as well as the transmittances, are stored in the storage device, such as RAM or HDD, arranged in the controller.

In this example, the sequential order of steps 303 and 304 may be replaced with each other. In the plasma processing apparatus in a state where the inside of the processing chamber 100 is open to the atmosphere during maintenance, step 301 of detecting the two transmittances on the inner wall of the liner 6 may be performed after the liner 6 is installed in the processing chamber 100 in step 302.

Next, the processing proceeds to stage 322 of the operation of wafer processing for manufacturing semiconductor device. After the operation is started, in step 305, the inside of the processing chamber 100 is high vacuum evacuated to discharge particles formed in the processing chamber 100 during the preceding plasma formation, thus temporarily reducing the pressure to that lower than a pressure at which the wafer processing is performed.

Subsequently, as described above, the wafer to be processed is conveyed in a room that is a decompressed space in a vacuum chamber, not shown, communicating with the vacuum chamber wall 5 in a state of being mounted on and held by a distal end of an expandable and retractable arm of a conveyance robot, not shown, into the processing chamber 100 (step 306), passed onto the sample stage 11, and mounted on the upper face of this stage. Furthermore, the gate valve that hermetically seals and divides the processing chamber 100 and the conveyance chamber is closed.

Next, in a state where the electrode for the electrostatic chuck in the coating film on the upper surface of the sample stage 11 is provided with direct current and the wafer is attracted onto the coating film on the upper surface of the sample stage 11, the process gas is supplied through the through-holes of the shower plate 3 into the processing chamber 100 while the operation of the vacuum pump evacuates the processing chamber 100. The pressure in the processing chamber 100 is set to have a value suitable for processing. Subsequently, the high-frequency power supplied to the inside of the processing chamber 100 forms plasma in an area on and above the sample stage 11 in the processing chamber 100, the high-frequency power supplied to the sample stage 11 forms a bias potential on the wafer, and the etching process for the film layer to be processed in the film structure on the wafer upper surface is started (step 307).

In this embodiment, an etching process in step 307 includes at least one step. In the case of including multiple steps, the process is performed in each step with different processing conditions, such as a plasma forming condition, magnitude of high-frequency power, and pressure value in the processing chamber 100 (the conditions being referred to as a recipe). In the diagram, the process includes N steps, where N is an arbitrary natural number.

Light from plasma formed in the processing chamber 100 during the processing in the step (each step in the case of multiple steps) of the etching process is received by the spectroscope 23 through the light receiving unit 101 and the radiation unit 102. The amounts of light are detected by the controller. Based on these detected amounts of light, the amounts of light from plasma incident on the light-receiving-side inner wall surface 103 and the radiation-side inner wall surface 104 of the liner 6 under processing are calculated by the calculator. The controller or the calculator of the plasma condition controller 30 calculates the distributions of density and intensity of plasma in the processing chamber 100 according to an algorithm described in software stored in the storage device on the basis of the amounts of light from plasma incident on two opposite positions on the inner wall surface of the liner 6, and also calculates the values of the dimensions (e.g., CD) of the shape of the wafer after processing obtained from the distributions of density and intensity, if necessary. Furthermore, based on a result of comparison between the calculated value and a predetermined value of permissible range, an instruction for achieving processing conditions in the processing chamber 100 for obtaining the desired processing result or the distribution of the result is calculated. The instruction is transmitted to the plasma processing apparatus to control the operation of this apparatus.

When reaching to the end point of the etching process is detected by the controller, not shown, from the output from the spectroscope 23, the plasma is extinguished based on the instruction signal from the controller, and the supply of the high-frequency power to the sample stage 11 is stopped. Subsequently, the arm of the conveyance robot enters the processing chamber 100, and the wafer is conveyed to the outside of the processing chamber 100 (step 308).

After the gate valve is closed to reseal the processing chamber 100, gas for cleaning is introduced into the processing chamber 100, plasma is formed in order to remove products having been generated in the processing chamber 100 during the preceding wafer etching and adhered to the surface of the inner wall member, and plasma cleaning is performed (step 309). This step 309 may be performed every time when the process to each wafer is finished, in conformity with the processing condition, the film structure on the wafer, and the material of the member constituting the inner wall of the processing chamber 100. Alternatively, this step may be performed every time when the process for a predetermined number of wafers is finished, in each interval between steps constituting the wafer processing.

In this embodiment, when the state of the inner wall surface of the liner 6 in the processing chamber 100 is determined to be cleaned equivalent to or can be regarded as the initial state before start of the process for a first wafer at the beginning in the operation for manufacturing semiconductor devices because cleaning is performed after completion of the wafer processing, the reference plasma is formed and the amount of light from the plasma is detected (step 310) as with steps 303 and 304, and the reference light from the external light source 21 is introduced into the processing chamber 100 through the radiation unit 102 and the light-transmitting window 7, and the amount of reference light having passed through the liner 6 in the processing chamber 100 is detected (step 311).

As with steps 303 and 304, the sequential order of steps 310 and 311 may be replaced with each other. Step 311 may be performed at any order between steps 305 to 309. As described above, in the case where the plasma is temporarily extinguished between multiple step items in step 307, step 311 may be performed in each interval.

In the case where there is any processing condition usable as the reference plasma in the step among the step items of step 307, the amounts of light $P_{m10\_sp}$ and $P_{m20\_sp}$ from the reference plasma may be detected in this step instead of step 310. In this case, it is desired that the step immediately preceding the step of forming the reference plasma have plasma that can remove the film adhering to the surface of the inner wall of the liner 6.

For example, in the case where step item 3 in step 307 is for forming the reference plasma, it is adequate to remove the film in step item 2. In this step item 2, plasma containing F (fluorine) or Cl (chlorine) may be used as plasma capable of removing the film of accretion.

In the case where the variation in the dimensions of the film structure as a processing result relative to increase in the number of processed wafers is sufficiently small, the amount of light from the reference plasma is not necessarily detected every time when one wafer is processed, and the number of wafers to be processed for which plasma cleaning in step 309 and detection of the amount of light of the reference plasma in step 310 are performed and from which a desired result is to be obtained can be selected, the number being a unit of a lot, or 100, 500, 1000 or the like. In the case where the number of wafers to be processed between the cleaning and the step of detecting the amount of light from the reference plasma is set to be large, the processing throughput by the plasma processing apparatus as a whole is improved.

The improvement in throughput can also be achieved by reduction in time required to detect the amount of light from the reference plasma. Meanwhile, to maintain such high detection accuracy, it is required to generate the reference plasma in a short time with favorable reproducibility. Thus, the discharge of the reference plasma is required to be maintained for a predetermined time or longer. The discharge time is desired to be at least one second. In order to further improve the reference plasma reproducibility, the time is desired to be at least five seconds, and the time is further desired to be at least ten seconds. In order to improve the throughput, the discharge time is desired to be five seconds or less, ten seconds or less, or thirty seconds or less in the case of each discharge time.

The detected amounts of light and the transmittance in this embodiment are stored in an external storage device communicatively connected to the controller, not shown, as time-series data or time-average data for each step of wafer processing, in a form of database information. In APC, the data is used to estimate CD as reference parameters, which is to be achieved.

Other data items stored in the database include the CD value of a shape after the wafer surface is processed, which is the processing result, and the conditions for wafer processing pertaining to the process. The processing conditions include the type and composition of gas introduced into the processing chamber 100, the flow rate of the gas, the pressure of the processing chamber 100, the magnitude of power supplied for generating plasma, and the like.

These data items are transmitted to the controller, not shown, or, a computer, such as a host computer, communicatively connected to the controller, and analyzed according to the algorithm described in preliminarily stored software. The processing conditions capable of achieving the desired CD value and the distribution, and data capable of highly accurately estimating the CD are calculated or extracted, thereby achieving highly accurate APC. When the amounts of light $P_1$ and $P_2$ from the plasma are detected, the difference or ratio between $P_1$ and $P_2$ can be used as the data for estimation.

The different wavelength of the OES data used in the APC is used in conformity not only with parameters for generating plasma, such as the type and pressure of the gas for generating plasma, the power source output, and the power source frequency, but also the material and shape of what is processed on the wafer surface, the material being any of Si, $SiO_2$, Sin, amorphous carbon, resist, Ti, Al, W, Cu and the like. Furthermore, the result of calculation through use not only of the specific wavelength data but also of multiple wavelength data items is adopted.

Consequently, the spectral data on the light from the plasma and the transmittance of the inner wall, which is obtained in this embodiment, is desired to be a wideband spectral. The wavelength range where no light emitted or the emission is weak in an optical spectrum of the light introduced from the external light source 21 is a range where the wavelength characteristics of plasma light $P_1$, $P_2$, $P_g$ and transmittances $t_1$, $t_2$ and $t_g$ cannot be obtained. Consequently, it is desired to adopt the external light source 21 having a wideband light source.

For supporting sequential processing of a number of wafers that require the cumulative time of forming plasma and processing wafers ranging from several tens of hours to several hundreds of hours, the output from the external light source 21 is desired to be stable at a predetermined value. Such a light source may be a xenon lamp, deuterium lamp, halogen lamp, LED, laser excitation light source or the like. Alternatively, a light source that is a combination of these light sources but has a single light output port may be adopted.

Figure 4:
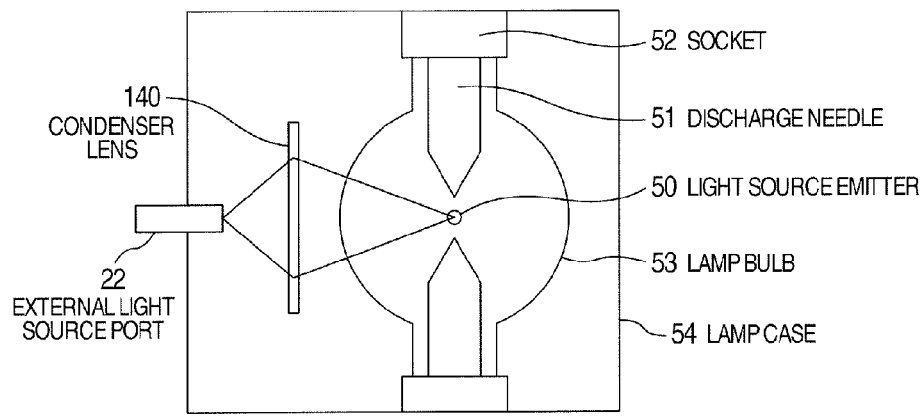
FIG. 4 is a longitudinal sectional view schematically showing a configuration of an external light source in the embodiment shown in FIG. 1.

In the external light source 21, the shapes of emission of light from one or more light sources are spot-shaped, linear, or planar. The light emitted from such a light source is condensed, and is guided to the external light source port 22 for output. An example of such a configuration is described with reference to FIG. 4. FIG. 4 is a longitudinal sectional view schematically showing a configuration of an external light source 21 in the embodiment shown in FIG. 1.

This diagram shows a case where the external light source 21 has a light emitter, which is a light source, is point-shaped. The external light source 21 includes a lamp case 54 that involves a lamp as a light source. A lamp bulb 53 is inserted and held between sockets 52 arranged opposite to each other in the lamp case 54. The lamp bulb 53 is filled with gas for discharge and sealed.

In the lamp case 54, the two discharge needles 51 are connected to a power source, not shown, via the sockets 52, and supplied with power. One ends of the discharge needles 51 are connected to the respective sockets 52 arranged opposite to each other. The other ends of the needles are arranged such that the distal ends are close to each other, and supplied with power, thereby forming a potential difference that has at least a predetermined value between the distal ends of the discharge needle 51.

The formation of the potential difference having at least the predetermined value between the discharge needles 51 allows discharge in a space in the lamp bulb 53 between these. A light source light emitter 50 is formed in the area where discharge occurs, and emits light. The size of the light source light emitter 50 in the embodiment ranges from several hundred nanometers to several millimeters, which is different according to conditions. Accordingly, for the sake of reducing the variation in amount of light output from the external light source port 22 before and after attachment of a new lamp bulb 53 to the lamp case 54 during replacement of the lamp bulb 53, the variation in the amount of light transmitted to the external light source port 22 due to the individual differences of light emission and dimensions of the lamp and attachment error of the lamp bulb 53 is required to be adjusted.

This embodiment is required to include a condenser lens 140 that is arranged between the lamp bulb 53 and the external light source port 22, which is made of cylindrical light-transmitting member attached through the side wall of the lamp case 54, and converges light radiated from the light source light emitter 50 and out of the lamp bulb 53 in the direction toward the external light source port 22, in the lamp case 54, thereby adjusting the relative position between the condenser lens 140 and the light source light emitter 50. In the case where multiple external light source ports 22 are provided, it is difficult to adjust each of the relative positions between the light source light emitter 50 and the external light source ports 22 so that they all fall within the desired range. It is also difficult to cause the amount of light to each external light output port to be constant. Consequently, the external light source port 22, which takes the light from the external light source 21, is desired to be a single port.

One cause of variation in the surface state in the processing chamber 100 is wearing of the surface material of the member constituting the inner wall, and adhesion of substances and particles in the plasma to the surface, due to interactions with the plasma as described above. In the case where such a member has light-transmitting property, light passing through the surface of the inner wall is affected by scattering, reflection, absorption or the like, depending on the shape, such as roughness of the surface of the inner wall, and the properties, such as the material, composition, and the thickness of deposits.

The light incident on the surface of the inner wall is scattered more with reduction in the wavelength of the passing light in comparison with the magnitude of the surface roughness of the inner wall, and the magnitude, such as thickness of accretion. Consequently, the shorter the wavelength of the light is, the more easily scattering occurs with respect to variation in minute surface shape, thus reducing the intensity of light reaching the light receiving unit side. As a result, the transmittances $t_1$, $t_2$ and $t_g$ decrease.

Consequently, as data representing the transmittance of the surface of the inner wall, not only the spectral data on transmittance but also data on the integral of the spectral data with respect to wavelength can be used. In this embodiment, for the sake of obtaining spectral data in a wide band, the liner 6 in the processing chamber 100, the light-transmitting windows 7, the collimator lens 14, the fibers 25 connecting the ports to each other, and the splitter 19 are required to be those allowing the corresponding spectrum to be passed.

For the sake of more correctly obtaining the amount of light on each optical path, it is desired that a single spectroscope 23 can detect all the optical paths to eliminate adverse effects due to the individual difference. Furthermore, it is desirable that the efficiency of the light from each port entering the spectroscopic element arranged in the spectroscope 23 is configured to be constant. To meet this requirement, the spectroscope port 24, which is an input port to the spectroscope 23, has a single configuration.

In this embodiment, between each of output ports, which are the light receiving port 15, the reference light port 17 and the reflection port 18, and the spectroscope port 24, the branched fibers 27 that connect these ports are arranged. The branched fibers 27 are optical fibers including multiple fibers that have one ends to which the multiple fibers from the ports on the branched side are connected, and have the other ends, which are bundled together, optically connected to the spectroscope port 24.

Figure 5:
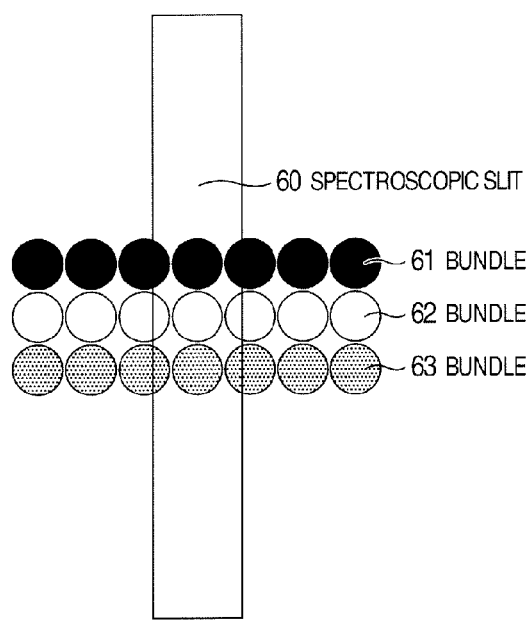
FIG. 5 is a longitudinal sectional view schematically showing a section of the other end of branched fibers in the embodiment shown in FIG. 1.
Figure 6:
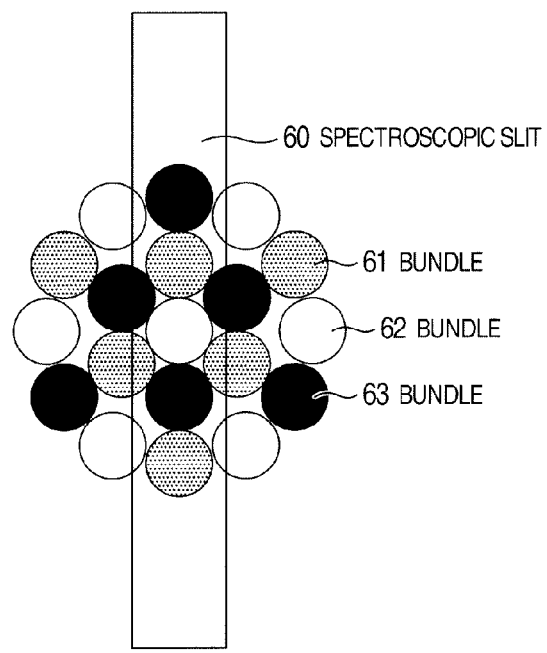
FIG. 6 is a longitudinal sectional view schematically showing a section of the other end of branched fibers in the embodiment shown in FIG. 1.

Referring to FIGS. 5 and 6, the sectional configuration of the other ends of the branched fibers 27 is described. FIGS. 5 and 6 is a longitudinal sectional view schematically showing a section of the other ends of branched fibers 27 in the embodiment shown in FIG. 1.

The spectroscope port 24 is provided with a spectroscopic slit 60 that is a slit allowing a part of light having transmitted through the branched fibers 27 to internally pass through toward the spectroscopic element in the spectroscope 23. In this embodiment, the slit that is the spectroscopic slit 60 is a longitudinal rectangular through-hole along the vertical direction in the diagram, and has a length in the long side direction ranging from 0.1 to several millimeters. The spectroscopic slit 60 is arranged to face the end faces of the plurality of optical fibers at the branched fibers 27, and made of material that can shield the area around the slit for allowing only a component of light having been transmitted and entered the inner area to pass through this slit.

In this embodiment, the optical fibers are arranged with respect to the spectroscopic slit 60 according to the arrangement shown in FIGS. 4 and 5, for the sake of achieving a constant efficiency of light or light having a reduced difference, the light emitted from each port on the branched side that are one ends of the branched fibers 27 enters the spectroscopic slit 60, between the bundles 61, 62 and 63, which are the other ends of the fibers from the respective ports. According to the example in FIG. 4, in the direction (the lateral direction in the diagram) intersecting the long side of the spectroscopic slit 60, sets of multiple optical fibers configuring the respective bundles 61, 62 and 63 are arranged in parallel. The sets are disposed in an overlaid manner so as to be in contact with each other along the long side direction. According to the example in FIG. 5, the bundles 61, 62 and 63, which are the sets of plural optical fibers constituting the three optical paths, are arranged in a hexagonal close-packed manner as a whole, and have a configuration where the periphery of each of the optical fibers in each bundle is alternately surrounded by each three optical fibers of two sets of bundles in the peripheral direction of the axis of the section.

In the configuration where the multiple bundles are thus arranged, the end faces on the other ends of the branched fibers 27 are parallel to the surface where the spectroscopic slit 60 is formed or oriented at a relative angle that can be similar to and regarded as parallel. Accordingly, the spectroscopic slit 60 faces the other end faces of the branched fibers 27 perpendicularly or at an angle similar thereto, and the area of each bundle at the end faces are configured to be similar to uniformity. This configuration reduce the unevenness of the amount of light in the predetermined amount of light having been transmitted from the one ends of each bundle and radiated from the other end faces facing the spectroscopic slit 60. The reduction can, in turn, reduce the individual difference of the components of light transmitted to the spectroscope 23 through different optical paths, thereby allowing the amounts of light, and the state of the surface of the inner wall obtained through comparison between these amounts to be highly accurately detected.

For the sake of correctly achieving the relative arrangement and the angular positions between the other end faces of the branched fibers 27 and the spectroscopic slit 60 for a long period, the optical fibers constituting each bundle that are provided with rotation stopper grooves or bushing lock rectangular connectors may be adopted. The optical paths for light output from the branched fibers 27 may be integrated by condensing means, such as a lens arranged between the spectroscopic slit 60 and the fibers, and the spectroscopic slit 60 may be irradiated with the light.

The configuration of this embodiment can divide the light radiated from the single external light source port 22 of the external light source 21 into two optical paths using the splitter 19, and highly accurately detect the amount of light $I_{in}$ radiated into the processing chamber 100 through the radiator port 16 from the reference external light $I_o$ using the transmission and reflection ratios St and Sr of the amounts of branched light. Furthermore, the light having transmitted through the light path from each of the light receiving port 15 in the light receiving unit 101, and the reference light port 17 and the reflection port 18 of the splitter holder 20 through the corresponding output port is combined by the branched fibers 27, and radiated from the end of the fibers to the single spectroscope port 24, and incident on the spectroscope 23.

This embodiment includes the configuration that reduces the difference of the efficiencies of components of each light incident on the spectroscope 23, and can highly accurately detect the amounts of the reference external light $I_0$, the inner-wall-transmitting external light $I_t$, the light-receptor-side plasma light $P_{m1}$, and the radiator-side plasma light $I_{m2}$. Through use of the data representing these detected amounts of light, the plasma light $P_1$ and $P_2$ incident on the light-receiving-side inner wall surface 103 and the radiation-side inner wall surface 104, the geometric mean $P_g$ of both components of the plasma light, the transmittances $t_1$ and $t_2$ of the light receiving unit side inner wall surface and the radiation unit side inner wall surface, and the geometric mean $t_g$ between both the transmittances can be highly accurately detected according to Equations (1.1) to (1.6).

Furthermore, the data on the amounts of light of the optical paths and the data on the amounts of the light emitted from the plasma itself and on the states of the surfaces of the inner walls, which have thus been obtained, are recorded as signals representing data in the database, and the plasma in the processing chamber 100 and the states of the processes using this data are highly accurately detected. The operation conditions and the processing conditions of the plasma processing apparatus are more correctly calculated using these results, and the processes of the plasma processing apparatus, whose operation is adjusted according to APC, are improved in yield.

In the above embodiment, a half mirror which allows the ratios $s_t$ and $s_r$ of transmission and reflection of light from the external light source 21 to be approximately the same may be adopted as the splitter 19. Alternatively, a splitter with $s_t$ and $s_r$ different from each other may be adopted.

Figure 7:
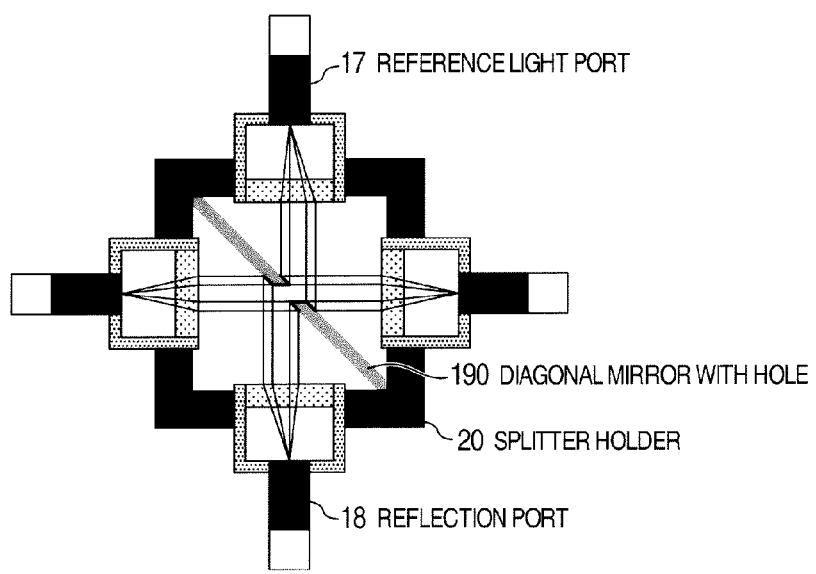
FIG. 7 is a longitudinal sectional view schematically showing an overview of a configuration of a modified example of a splitter and a splitter holder in the embodiment shown in FIG. 1.
Figure 8:
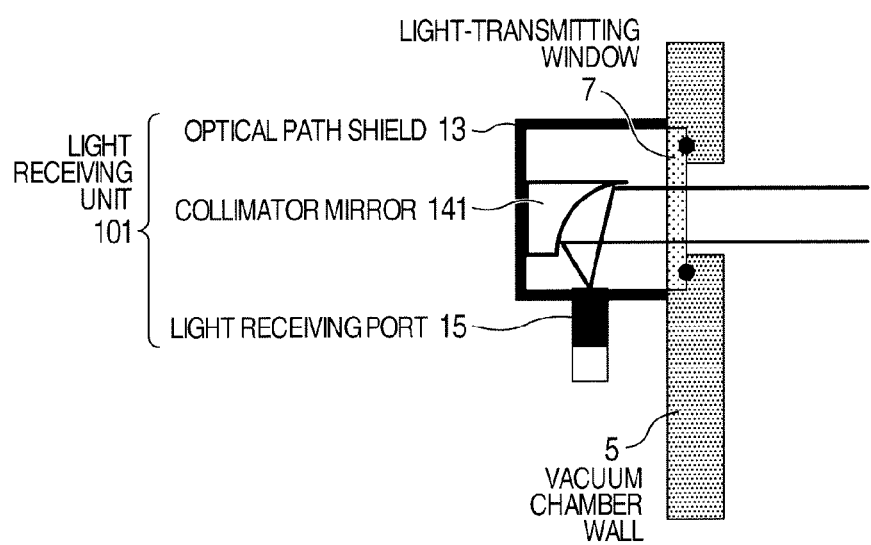
FIG. 8 is a longitudinal sectional view schematically showing a modified example of means for optical collimation for a light receiving unit and a radiation unit according to the embodiment shown in FIG. 1.

As shown in FIG. 7, double-sided total reflection mirror including a through-hole at the center as shown in FIG. 6 may be adopted as the splitter 19. FIG. 7 is a longitudinal sectional view schematically showing an overview of a configuration of a modified example of the splitter 19 and the splitter holder 20 according to the embodiment shown in FIG. 1.

In this diagram, a diagonal mirror with a hole 190 is adopted as the splitter 19. The light in the transmission direction entering the diagonal mirror with a hole 190 passes through the through-hole arranged at the center, and the light in the reflection direction is reflected by the member having high reflectivity around the through-hole. The St and Sr can be changed by changing the diameter of the through-hole. The member of which the diagonal mirror with a hole 190 is made of may be a member that completely blocks light or has a high light blocking performance.

Furthermore, at the light receiving unit 101 and the radiation unit 102, a reflective collimator mirror 141 as shown in FIG. 7 may be adopted. FIG. 7 is a longitudinal sectional view schematically showing a modified example of means for optical collimation for the light receiving unit 101 and the radiation unit 102 according to the embodiment shown in FIG. 1.

In this diagram, the collimator mirror 141 is arranged at a position on the inner wall surface opposite to the light-transmitting window 7 in the optical path shield 13 of the light receiving unit 101. The surface opposite to the light-transmitting window 7 includes a reflective surface that has a curved surface that reflects parallel light having passed through the light-transmitting window 7 and entered so as to be condensed toward the end face of the light receiving port 15 attached through the lower part (the lower side on the diagram) of the inner wall of the optical path shield 13.

In the case where detection cannot be made by the spectroscope 23 because the intensity of light to be detected is too strong, the intensity and amount of such light is required to be attenuated. For such reduction, an optical attenuator by means of an ND filter or iris, can be arranged on the optical path before or after the shutter 27. Alternatively, the shutter 27 may be a variable attenuation ratio optical attenuator, which blocks the light and adjusts the transmission ratio during light transmission.

In the case of adopting such an attenuator, with respect to light entering the attenuator, a transmittance after light passing through the attenuator is added to the aforementioned Equations (1.1) to (1.6). The transmittances after light passing through the attenuator provided at the positions of the shutters 27*a* to 27*e* or before or after the light paths are assumed as $a_a$ to $a_e$. In this case, $I_o$, $I_{in}$, $I_t$, $I_{m1}$ and $P_{m2}$ in Equations (1.1) to (1.2) are replaced with $a_aI_o$, $a_bI_{in}$, $a_cI_t$, $a_cP_{m1}$ and $a_ba_cP_{m2}$, respectively, so that the inner wall transmittances $t_1$, $t_2$ and $t_g$ and the plasma light $P_1$, $P_2$ and $P_g$ can be obtained.

Figure 9:
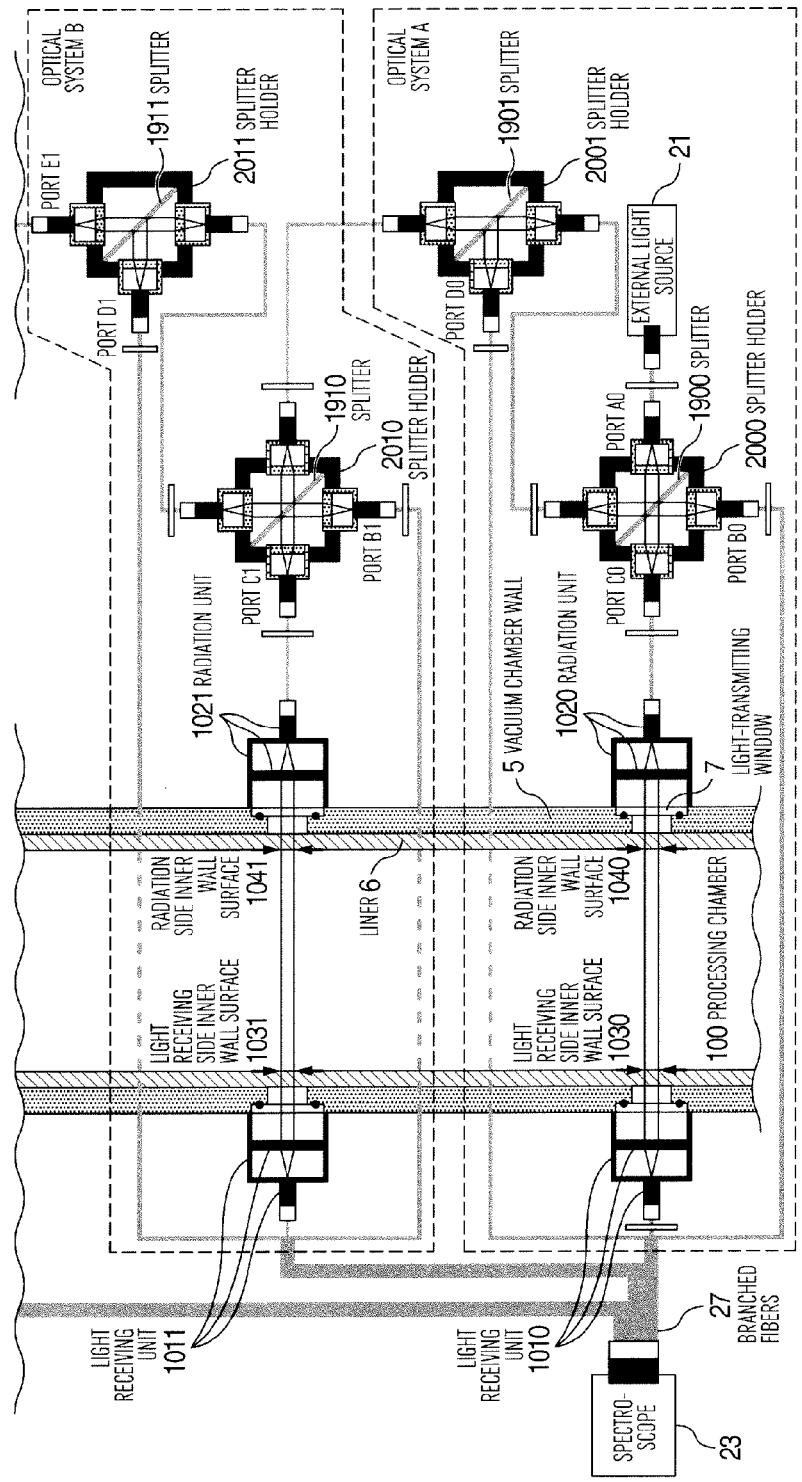
FIG. 9 is a longitudinal sectional view schematically showing an overview of a configuration where multiple optical systems in the embodiment shown in FIG. 1 are arranged.

FIG. 9 shows an example of a configuration where multiple optical systems, each of which has been shown in the above embodiment, are provided. FIG. 9 is a longitudinal sectional view schematically showing an overview of a configuration where multiple optical systems in the embodiment shown in FIG. 1 are arranged.

The modified example in this diagram has a configuration where a single processing chamber 100 of a single plasma processing apparatus is provided with multiple sets each including the splitter 19 that branches the reference light from the external light source 21, optical fibers that transmit each of branched components of light, and an optical system that includes a radiation unit 102 which radiates inside the processing chamber 100 and a light receiving unit 101 and is for detecting OES data at each of the inside and outside of the processing chamber 100, between the external light source 21 and the spectroscope 23 included in the embodiment of FIG. 1. That is, the modified example of FIG. 9 is configured such that an optical system A and an optical system B each of which has a configuration equivalent to that of the embodiment of FIG. 1 are coupled with each other by optical fibers connecting the splitter and the light receiving unit to each other of each set, the reference light from the external light source 21 is transmitted from one to the other, and the optical systems A and B can detect OES data from the state of the surface of the inner wall of the processing chamber 100 and the light from the plasma in the processing chamber 100 in parallel.

The optical system A in this example is provided with a splitter holder 2001 that involves a splitter 1901, between the port of a splitter holder 2000 of the optical system A equivalent to the reference light port 17 included in the splitter holder 20 in FIG. 1 and the spectroscope port 24, and these elements are connected by optical fibers so as to allow light to be transmitted. The reference light from the external light source 21, having been introduced into the splitter holder 2000 of the optical system A and branched by the splitter 1900 included therein, is introduced by the splitter holder 2001, branched by the splitter 1901 in the holder into a port D0 that configures the optical system A and is connected to the spectroscope port 24 through optical fibers so as to allow light to be transmitted, and a port connected to a port of a splitter holder 2010 of the optical system B through optical fibers so as to allow light to be transmitted, and supplied to these ports.

This example has the configuration where the reference light from the external light source 21 can be transmitted to the optical systems A and B, which are arranged in different positions of the processing chamber 100 and constitute the different optical paths in the processing chamber 100. Adjustment of opening and closing the shutters arranged on the optical fibers detects the amounts of light from the processing chamber 100 and light from the external light source 21 and the transmittance of the inner wall of the processing chamber 100 in each of the optical systems in parallel or independently. The external light source 21 is not directly connected to the optical system B. However, the reference light supplied through the splitter 1901 provided for the optical system A can be used as the reference external light for the optical system B.

An optical system that has a configuration similar to the optical system B and is arranged at the different position in the processing chamber 100 can be connected through optical fiber to the port through which the reference external light to be transmitted through the splitter 1911 of the optical system B passes. Such series connection of the different optical systems using the optical fibers and splitters can use the reference light from the external light source 21 branched off from the splitter as the reference external light, and detect the variations in condition at multiple points in the plasma and on the inner wall surface of the processing chamber 100.

For example, each of multiple optical systems including the optical systems A and B is arranged such that the optical path in the processing chamber 100 of each optical system are disposed at a different position in the direction of the central axis of the cylinder of the cylindrical processing chamber 100 or in a plane perpendicular thereto. Through this arrangement, according to the intensities of plasma in the direction of the central axis (height) and the horizontal (or circumferential direction) direction, the distribution of densities or states on the processing chamber 100 can be detected. The detected these results are stores in the storage device as data of the database and analyzed, thereby allowing more highly accurate APC to be achieved.

Figure 10:
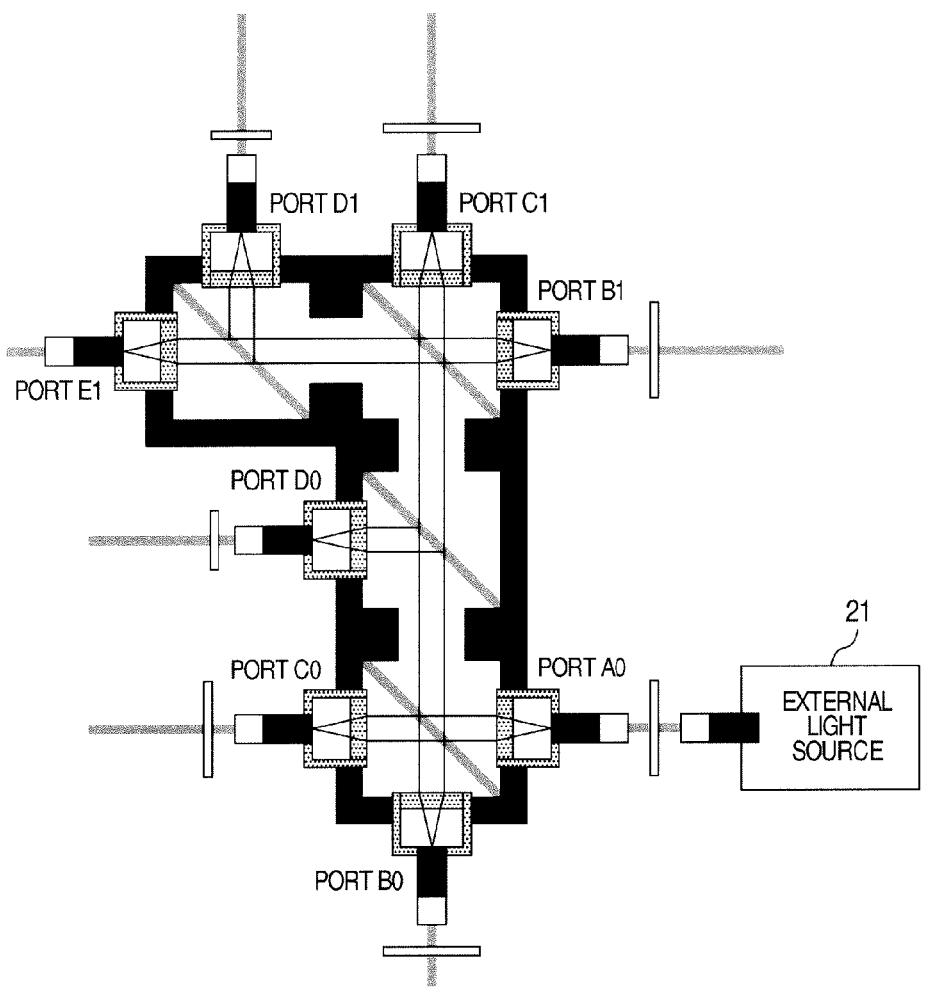
FIG. 10 is a longitudinal sectional view schematically showing an overview of a configuration of another example of a splitter that couples the optical systems A and B shown in FIG. 9.
Figure 11:
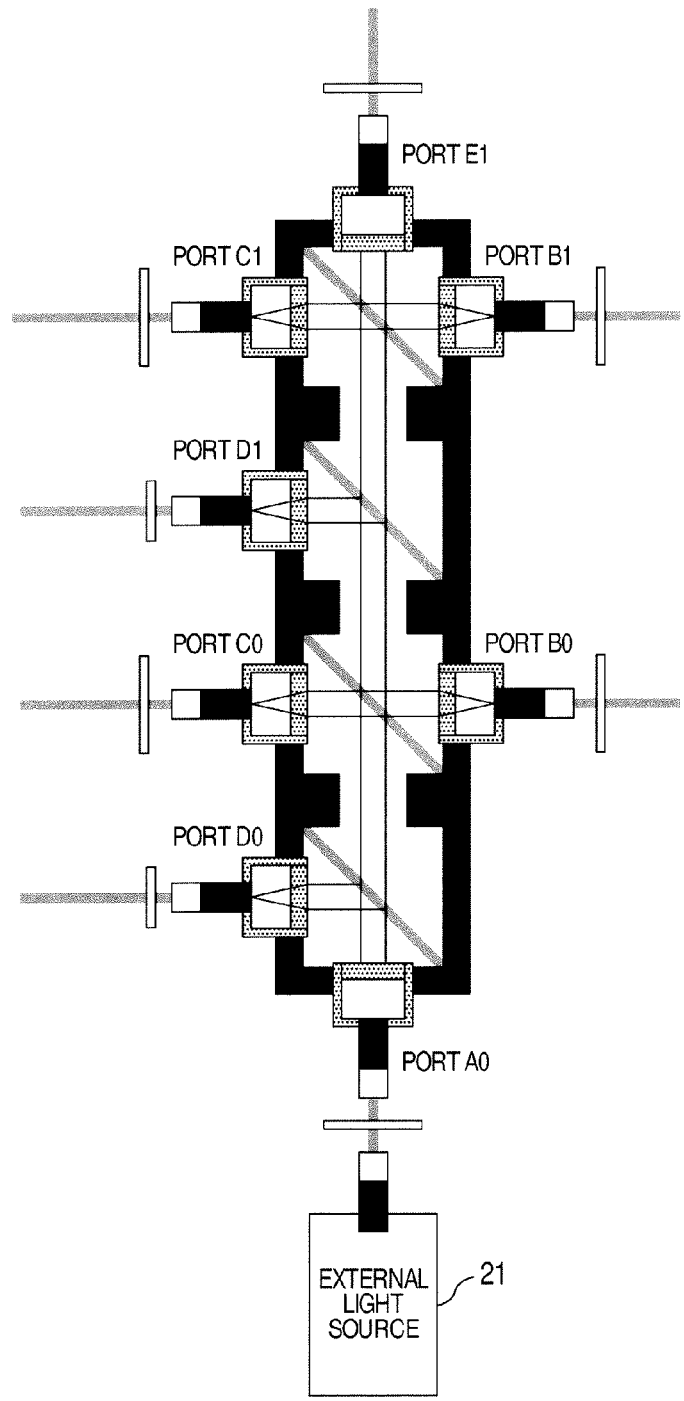
FIG. 11 is a longitudinal sectional view schematically showing an overview of a configuration of another example of a splitter that couples the optical systems A and B shown in FIG. 9.

FIGS. 10 and 11 is a longitudinal sectional view schematically showing an example of a configuration of another configuration example of the splitter 1901 that couples the optical systems A and B shown in FIG. 9. In this example, instead of the configuration shown in FIG. 9 where the splitter holders 2000, 2001, 2010 and 2011 are connected through the optical fibers, a configuration where the outer wall surfaces of the holders are connected to each other no as to allow the through-holes arranged on the side walls of the respective holders to be connected to each other is adopted, thereby allowing the multiple splitter holders to be treated as an integrated series of members.

Alternatively, as shown in FIG. 11, these splitter holders 2000, 2001, 2010 and 2011 may linearly be coupled by connecting the outer wall surfaces to each other, thereby constituting an integrated splitter holder. FIG. 11 shows a configuration applied in the case where the optical systems A and B are installed in the processing chamber 100. In these diagrams, the ports connected to the splitter holder shown in FIG. 9 and the ports shown in FIG. 10 are indicated by the same reference characters, which are ports A0 to D0, A1 to D1 and E1, thereby showing the correspondence.

In the case where more optical systems are provided, another one splitter holder shown in FIG. 11 may be prepared, the port E1 of the first splitter holder may be taken out, the port A0 of the second splitter holder may be taken out, and the ports E1 and A0 of both the splitter holders may be connected to each other. Alternatively, multiple sets each including two splitters embedded in a single splitter holder may be adopted. As described above, use of the splitter holder in which the multiple splitters are provided can reduce the number of fibers between the splitter holders and the number of ports connected to the splitter holder.

Modified Example

Figure 12:
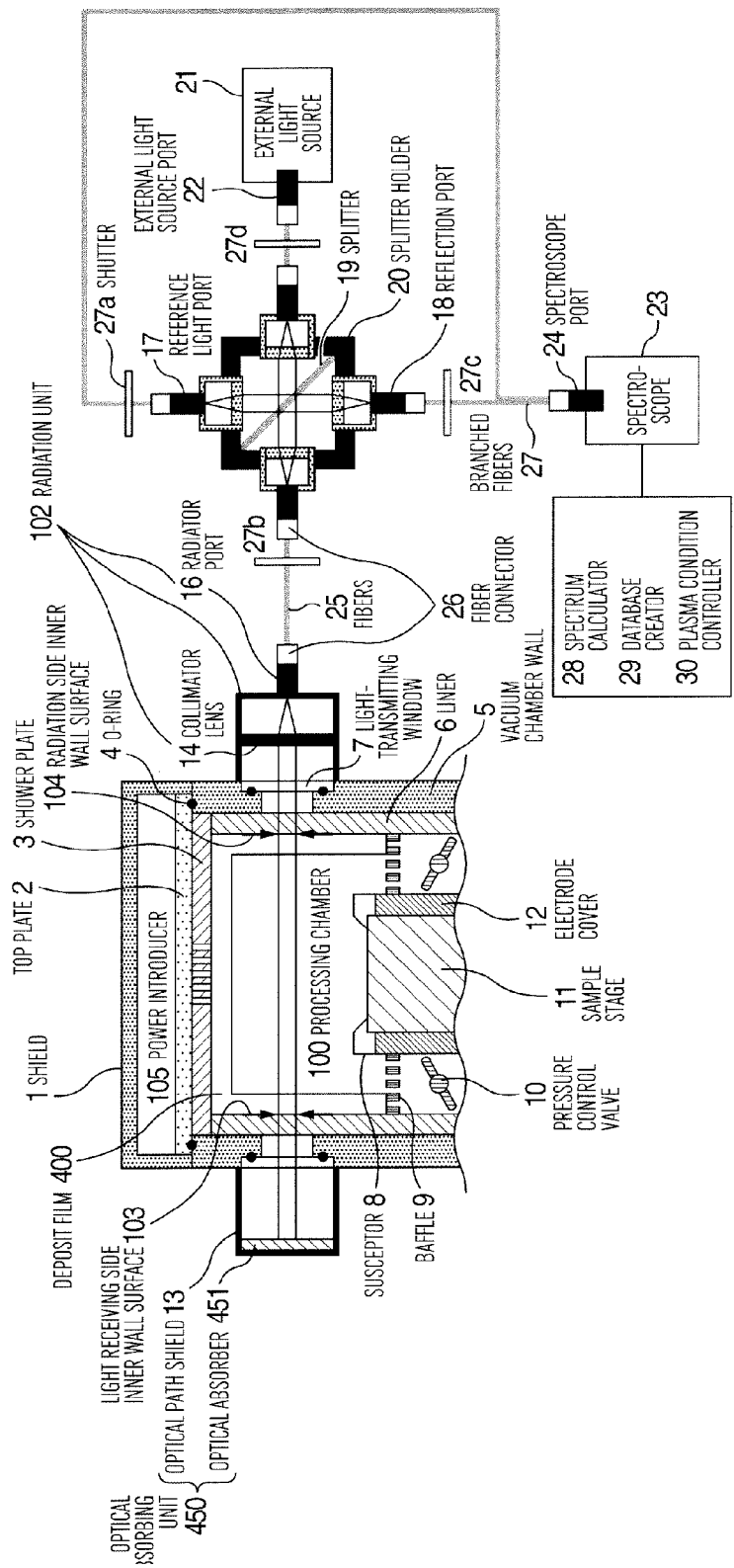
FIG. 12 is a longitudinal sectional view schematically showing an overview of a configuration of a plasma processing apparatus according to a modified example of the embodiment shown in FIG. 1.

Next, a modified example of the above embodiment is described with reference to FIGS. 12 to 15. FIG. 12 is a longitudinal sectional view schematically showing an overview of a configuration of a plasma processing apparatus according to a modified example of the embodiment shown in FIG. 1.

The plasma processing apparatus according to this example detects the variations in the film of accretion formed on the surface of the inner wall of the liner 6 arranged in the processing chamber 100 during wafer processing, or in the condition of the coating film formed for the sake of protecting the inner wall before and after the processing. Configuration elements shown in FIG. 12, except for an optical absorbing unit 450, the branched fiber 27, and the deposit film 400, are equivalent to those described in the embodiment shown in FIG. 1. Consequently, the description on the elements is omitted unless specific description is required.

In this example, the optical absorbing unit 450 disposed outside of the vacuum chamber wall 5 at a height position similar to that of the light receiving unit 101 on the vacuum chamber wall 5 of the embodiment shown in FIG. 1 includes an optical path shield 13 made of a member that constitutes the outer wall surface and does not allow the reference light to pass, and an optical absorber 451 disposed at a site opposite to the through-hole in the vacuum chamber wall 5 in the optical path shield 13. The optical path shield 13 blocks light from a light source, such as illumination, arranged around the plasma processing apparatus, with respect to the through-hole and the optical absorber 451, thereby preventing the light emitted by the light source therearound from entering the processing chamber 100 and functioning as noise light against the light from the processing chamber 100, which is to be detected through the spectroscope 23.

In the optical absorbing unit 450, the optical absorber 451 faces the light-transmitting window 7 through the through-hole disposed at a position on the vacuum chamber wall 5 opposite to the radiator port 16 of the radiation unit 102 and the light-transmitting window 7 sandwiching the space where plasma is formed in the processing chamber 100. Consequently, the light having passed through the inside of the processing chamber 100 and reaching the optical absorbing unit 450 is prevented from reflecting in the optical absorbing unit 450 and returning to the radiator port 16.

For effectively achieving the working effect, the optical absorber 451 is required to have a size larger than the sectional area of the parallel light from the collimator lens. It is only necessary for the optical absorber 451 to be arranged in a form of blocking the optical path of the parallel light from the collimator lens. This absorber is disposed in a space in the optical path shield 13 of the optical absorbing unit 450 so as to face the light-transmitting window 7 on the side of the radiation unit 102 through the through-hole of the vacuum chamber wall 5. Alternatively, the optical absorber 451 may cover the inner wall surface of the optical path shield 13 to cover the surface. Alternatively, the space in the optical path shield 13 may be densely filled with the optical absorber 451.

The optical absorber 451 may be arranged on the side surface on the atmosphere side or all the surfaces on the atmosphere side of the light-transmitting window 7. Alternatively, the optical absorber 451 may be disposed on the surface of the light-transmitting window 7 on the side nearer to the processing chamber 100 (vacuum side), or on the surface in the vacuum chamber wall 5 with no light-transmitting window 7 with which the parallel light from the collimator lens is irradiated.

The optical absorber 451 may be arranged by means of coating the inner surface of the optical path shield 13 with black paint, causing an antireflective film to adhere onto the inner surface, black-colored alumite-treatment of the inner surface through anode oxidation, or forming an antireflective fine pattern, ouch as a moth eye structure or the like. Alternatively, the configuration may be achieved by arranging a platelike member subjected to any of such surface processes in the optical path shield 13. Yet alternatively, the surface process may be applied to a surface of another light-transmitting window arranged to block the through-hole in the vacuum chamber wall 5 on the side nearer to the processing chamber 100 in the optical path shield 13.

Branched fibers that branch off into two bundles are adopted as the branched fibers 27. Two inner bundles are configured to be included in the entire bundle of the branched fibers 27, and achieve the fiber arrangement relative to the slit of the spectroscope 23, the angle at which the fibers are fixed, the configuration of fiber connectors are made as those shown in FIGS. 5 and 6. This configuration highly accurately detects the amount of light from the processing chamber 100 and the transmittance of the inner wall of the processing chamber 100, and improves the detection accuracy of the state of the film of accretion and the coating film for protection.

On the surfaces of the liner 6 and the shower plate 3, which constitute the inner wall of the processing chamber 100, a film of accretion or a deposit film 400 is formed as a protective film. Although not shown in this example, the deposit film 400 is formed not only on the above elements but also on the surface of the top plate 2, the vacuum chamber wall 5, the light-transmitting window 7, the susceptor 8, the baffle 9, the sample stage 11, and the electrode cover 12, which constitutes the inner wall surface of the processing chamber 100.

The configuration shown in FIG. 1 may be adopted to prevent the reference tight emitted by the external light source 21 introduced through the radiation unit 102 and then through the liner 6 and into the processing chamber 100, and the light emitted by the plasma formed in the processing chamber 100 from being reflected in or out of the processing chamber 100 and returning to the radiator port 16. In FIG.

1, the reference light having been emitted from the external light source 21 and entered the light receiving unit 101 and the light from the plasma enter the light receiving port 15, and are input into the spectroscope port 24. Consequently, the intensity of the light reflected by the light receiving unit 101 and returning to the radiator port 16 can be sufficiently weaken.

Also in this example, the spectral data on each component of the light detected by the spectroscope 23 is calculated by the spectrum calculator 28, and stored un OES data in the database of the database creator 29. The data is transmitted to the plasma condition controller 30 and used. An instruction signal for causing the calculator to achieve a target value calculated by the calculator according to a predetermined algorithm is issued, and APC is performed.

Next, in this example, the configuration of detecting the variation in the condition of the film of accretion formed on the inner wall surface of the processing chamber 100 or in the coating film for protection on the basis of the information on the detected amounts of light and the transmittance is described. In this example, the reference external light $I_o$, the background light $I_b$, the interference measured light $I_m$, interference light $I_f$, and the radiator-side plasma light $P_{m2}$ are used as the amounts of detected light. As with the embodiment, the reference external light $I_o$ and the radiator-side plasma light $P_{m2}$ are amounts of light detected after transmission through the optical fibers connected to the reference light port 17 and the radiator port 16 of the splitter holder 20 and then through the branched fibers and the spectroscope 23.

The background light $I_b$ is an amount of light reflected in the processing chamber 100 or outside of this chamber and entering the spectroscope 23 through the radiator port 16, the splitter 19 and the like when the reference light from the external light source 21 is emitted from the radiator port 16 in a state with no plasma and no film of accretion on the inner wall surface of the liner 6 or no film for protection or in a case that can be regarded to be similar thereto.

Unlike the embodiment, this example does not include the light receiving unit 101, but has a configuration where the spectroscope port 24 and the spectroscope 23 connected along optical path through the branched fibers 27 to the reflection port 27c provided for the splitter holder 200 on the side nearer to the radiation unit 102 receives light from the plasma entering the radiation-side inner wall surface 104 together with the light reflected by the light-receiving-side inner wall surface 103 of the liner 6 and by the coating film on this surface. Thus, the radiator-side plasma light $P_{m2}$ can be regarded as the light-receptor-side plasma light.

A several percent of the light in the visible light range entering the interface between the quartz and vacuum or atmosphere is reflected. Consequently, the background light $I_b$ occurs. For the sake of improving the accuracy of detecting the state of the film of the inner wall surface of the processing chamber 100 using the interference light $I_f$, the intensity of the background light $I_b$ is desired to be reduced. For meeting the requirement, an antireflective film is desired to be provided on the surface of each of the input and output ports, lenses, and windows arranged in the atmosphere or in contact with the atmosphere.

The interference measured light $I_m$ is the amount of light including a specific wavelength component entering the spectroscope 23 when the reference light having a specific wavelength from the external light source 21 is radiated from the radiator port 16 during formation of plasma or in a state where plasma is extinguished and in a state where the film is formed on the inner wall surface of the processing chamber 100. The interference measured light $I_m$ contains the background light $I_b$, the radiator-side plasma light $P_{m2}$ that is light from plasma being formed, the interference light $I_f$ occurring from the film on the surface of the inner wall. Consequently, the state of the film can be detected using the result of detecting the interference measured light $I_m$. After the variations of the intensities of the background light $I_b$ and the interference light $I_f$ due to the variation in the intensity of reference external light $I_0$ are corrected, the relationship with the interference measured light $I_m$ becomes that according to Equation (3.1).

$$I_m = \frac{I_f + I_b}{I_0} + P_{m2} \tag{3.1}$$

The interference light $I_f$ is calculated by the calculator of the controller, not shown, using Equation (3.1), according to a predetermined algorithm based on Equation (3.2).

$$I_f = (I_m - P_{m2})I_o - I_b \tag{3.2}$$

In a state without plasma in the processing chamber 100, $P_{m2}=0$ in Equations (3.1) and (3.2). The values of the reference external light $I_o$, the background light $I_b$, and the light-receptor-side plasma light $P_{m2}$ detected using the output of the spectroscope 23 are calculated from these equations, thereby allowing only the interference light $I_f$ to be calculated. It is thus understood that the state of the film can highly accurately be detected.

The interference measured light $I_m$ and the radiator-side plasma light $P_{m2}$ on the same time during plasma formation cannot be simultaneously detected from the output of the spectroscope 23. Consequently, for highly accurately detecting the interference light $I_f$ from the film on the inner wall surface that is subject to formation and decomposition during plasma formation, the interference measured light $I_m$ and the light-receptor-side plasma light $P_{m2}$ are required to be detected at small time interval as short as possible. To meet this requirement, turning on and off the radiation of reference light from the radiator port 16 into the processing chamber 100 may be repeated, such as by on and off of the radiation of the reference light from the external light source 21 or by opening and closing of the shutter 27d.

Typically, the variation in plasma light emission is large immediately after formation of plasma. Consequently, switching on and off of the radiation of the reference light is desired to be performed within one second. For improvement in the accuracy of detecting the state of the film on the inner wall surface of the processing chamber 100 and temporal resolution, the time is desired to be within 0.5 seconds. Furthermore, it is desired for switching to be performed within 0.1 second.

During detection of the reference external light $I_o$, the background light $I_b$, the interference measured light $I_m$, interference light $I_f$, and the radiator-side plasma light $P_{m2}$, blocking and connection of each optical path included in the modified example may be appropriately selected as with the operation of opening and closing the shutter 27 shown in FIG. 2. During measurement of the background light $I_b$ and the interference measured light $I_m$, the shutters 27a and 27e may be closed and the shutters 27b, 27c and 27d may be opened. In order to turn on and off the radiation of the reference light from the external light source 21, the shutter 27d may be open and closed.

Figure 13:
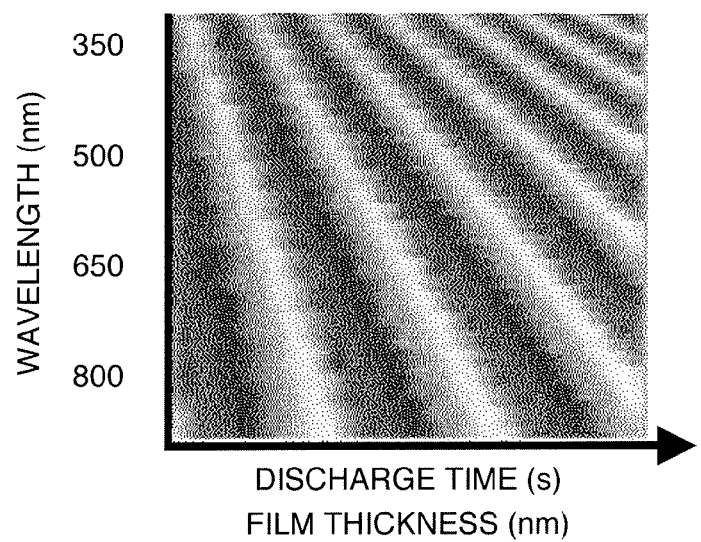
FIG. 13 is a graph showing variation in the amount of interference light If from the film on the surface of the inner wall of the processing chamber 100 detected in the modified example in FIG. 12, versus temporal variation.

FIG. 13 shows the variation in interference light $I_f$ from the film that is formed on the inner wall surface and has a varying thickness with lapse of time of progress of the process after start of plasma formation and wafer processing. FIG. 13 is a graph showing variation in the amount of interference light $I_f$ from the film on the surface of the inner wall of the processing chamber 100 detected in the modified example in FIG. 12, versus temporal variation.

The ordinate and the abscissa in this diagram indicate the wavelength and time after start of wafer processing by means of plasma, respectively. The color gradation represents the magnitude in intensity of interference light $I_f$ at each wavelength. That is, this diagram shows the pattern of intensity with a parameter that is the wavelength of the interference light according to formation of the film on the inner wall surface of the processing chamber 100 in this modified example and the temporal variation of the pattern. The pattern of variation in interference light $I_f$ obtained in this diagram is referred to as an interference spectral pattern.

The value of time during processing and after start of the process on the abscissa of FIG. 13 corresponds to the thickness of the film on the inner wall surface. In the case where the characteristics of plasma formed in the same wafer processing are stable and the variation thereof is sufficiently small, the thickness of the film at each time can be detected from the value corresponding on the interference spectral pattern. Instead, if the interference spectral pattern varies even in the case where formation of the plasma is repeated under the same condition, it is shown that the film thickness or the material of the film varies.

As described above, as to the interference light spectrum after the process of forming plasma in the processing chamber 100 and forming the film on the inner wall surface or execution of plasma cleaning for removing the deposit film, the variation in spectrum with increase in the number of processed wafers or the cumulative value of time during which plasma is formed and the process is performed is detected, thereby allowing the variation in the state of the film to be detected.

Alternatively, the interference light spectral pattern during formation of the film on the surface of the inner wall or during removal of the film in cleaning is obtained, and the variation in interference spectral pattern with increase in the cumulative number of processed wafers or processing time may be obtained, thereby allowing the variation in the state of the film to be detected. The method of obtaining the variation in interference spectral pattern may be through use of variation in the spectral pattern at a specific time in plasma forming process, or temporal variation in the intensity of light having a specific wavelength.

As described above, also in this modified example, for the sake of detecting the variation in the state of the film formed on the inner wall surface of the processing chamber 100, the interference spectral or the interference spectral pattern is obtained. Consequently, the external light source 21 is desired to be a wideband light source.

As with the embodiment, also in this example, the variation value or the variation ratio of the interference measured light $I_m$, the interference light $I_f$ or the interference light spectral pattern with increase in the cumulative number of processed wafers or processing time can be used as the parameter for determining whether to stop the wafer processing in the operation of the apparatus for manufacturing devices. As described above, the specific timing of stopping the wafer processing is desired to be timing when the variation ratio of the interference measured light $I_m$, the interference light $I_f$ or the interference light spectral pattern become at least a value selected by a user, which is any of 10%, 5% and 3% according to reduction width of the required processing variation.

Each component of light obtained in measurement of the state of the deposit film or the coating film in the present invention is stored in the database as time-series data or time-average data on each wafer before and after start of mass production and during mass production. In APC, the data is used as measurement data for estimating CD, which is to be controlled.

Furthermore, the data stored in the database includes CD data as an inspection result, and a plasma condition, as described above. The plasma conditions include many items, such as gas type, gas flow rate, pressure, and plasma generating power. The data is analyzed to find the plasma conditions capable of controlling CD, and measured data capable of highly accurately estimating CD, thereby allowing highly accurate APC.

Figure 14:
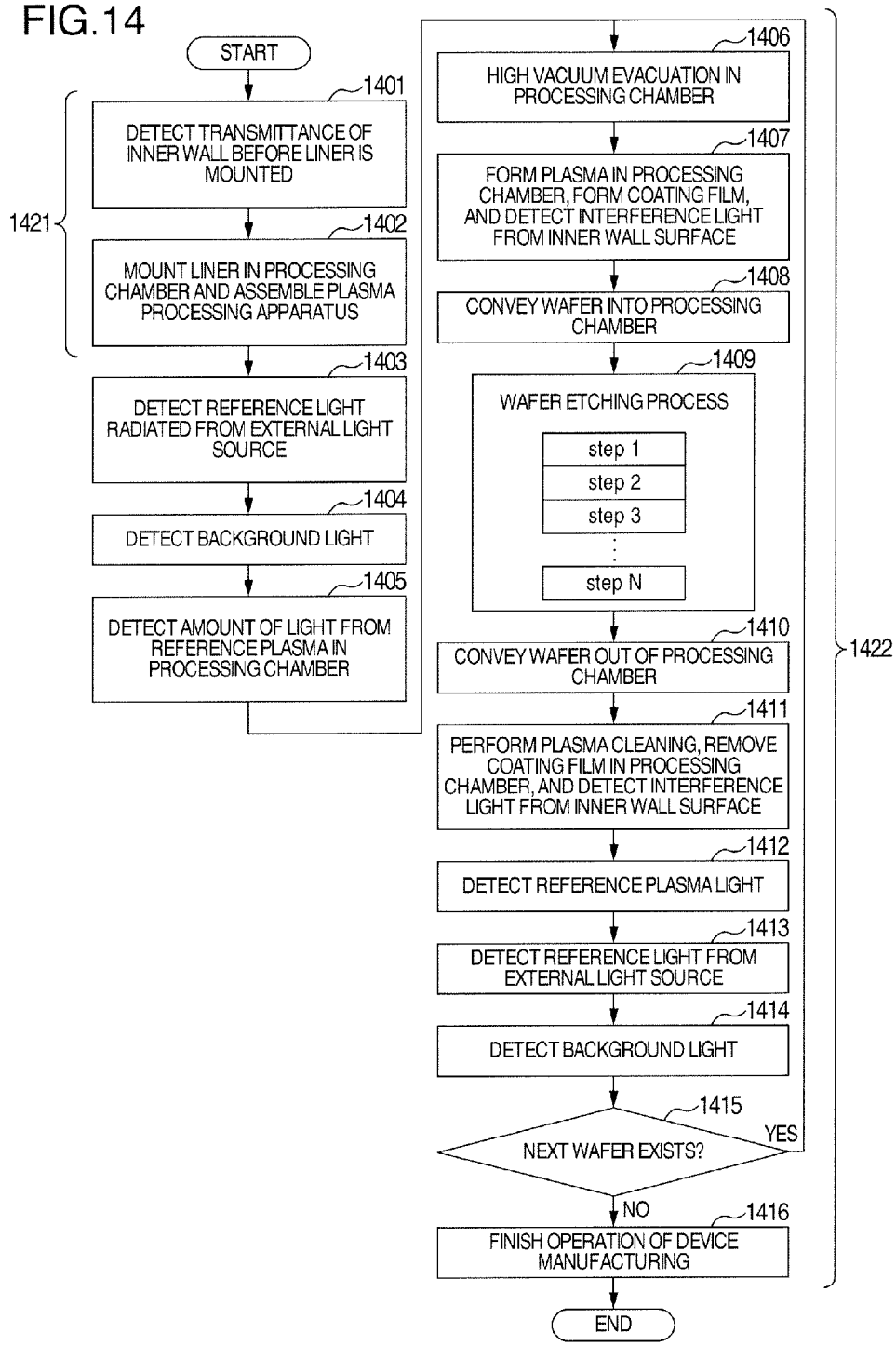
FIG. 14 is a flowchart showing a flow of operation of detecting the thickness or the state of the film on the surface of the inner wall of the processing chamber in the modified example in FIG. 12.
Figure 15:
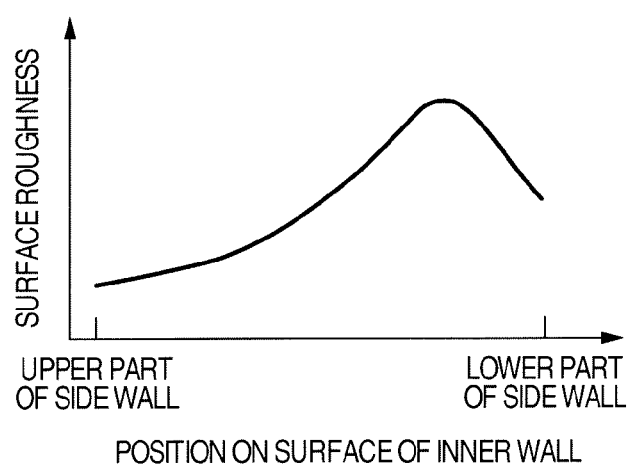
FIG. 15 is a graph schematically showing the distribution of surface roughness of the surface of an inner wall of a processing chamber of a plasma processing apparatus according to a conventional technique at different positions in the vertical direction on the surface of the inner wall of the processing chamber.

Referring to FIG. 14, the flow of operation of detecting the thickness or the state of the film on the surface of the inner wall of the processing chamber 100 in the modified example is described. FIG. 14 is a flowchart showing a flow of operation of detecting the thickness or the state of the film on the surface of the inner wall of the processing chamber in the modified example in FIG. 12.

As with the embodiment, the reference external light $I_0$, the radiator-side plasma light $P_{m2}$ and the like are the amounts of light detected from the reference light port 17 and the radiator port 16, respectively, by the operation of selecting the optical path made of optical fibers according to selective opening and closing the shutters 27a to 27d shown in FIG. 2.

Also in the plasma processing apparatus in this example, similarly to in the embodiment, the light transmittance $t_{20\_sp}$ of the surface of the inner wall of the liner 6 on the surface nearer to the radiation unit 102, and the reflectivity $r_{10\_sp}$ on the surface nearer to the optical absorbing unit 450 are detected wherein the surface of the inner wall is cleaned after the taken out of the processing chamber 100 during execution of the operation of the maintenance stage 1421 (step 1401). At this time, the configuration for detecting the reference light from the external light source 21, such as light source 21, shown in FIG. 12, and the light from the plasma may be adopted. Alternatively, the transmittance and the reflectivity may be detected in the case where the liner 6 is disposed in the problem 100 in the vacuum chamber wall 5.

Also in this example, it is assumed that the values of the reflectivity $r_{10}$ and the transmittance $t_{20}$ of the inner wall of the liner 6 detected using the reference light from the external light source 21 in step 1401 can be regarded as the reflectivity $r_{10\_sp}$ and the transmittance $t_{20\_sp}$ of the inner wall of the liner 6 detected using the light from the reference plasma, respectively, and the following description is made. These $r_{10\_sp}$ and $t_{20\_sp}$ are referred to as transmittance and the like.

As described above, the transmittance and the like $r_{10\_sp}$ and $t_{20\_sp}$ detected in step 1401 are stored in the RAM arranged in the plasma condition controller 30 or a storage device, such as HDD, disposed at a remote site, in a manner communicative with the plasma condition controller 30. Next, the maintenance is finished after assembling of the plasma processing apparatus including mounting of the liner 6 in the processing chamber 100, and the operation, such as checking of leakage of vacuum evacuation in the processing chamber 100 are performed (step 1402).

Subsequently, a determined amount of reference light is emitted from the external light source 21, an optical path including optical fibers is selected according to the operation of selectively opening and closing the shutters 27a to 27d shown in FIG. 2, and the amounts of light $I_{00}$ and $I_{r0}$ are detected (step 1403). Through use of the detected $I_{00}$ and $I_{r0}$ and the values of ratios St and Sr of transmission and reflection of the splitter 19 determined in advance based on the specifications, the amount of radiated light $I_{m0}$ is calculated. Subsequently, the predetermined amount of reference light from the external light source 21 is radiated out of the radiator port 16, and the background light $I_{b0}$ is detected (step 1404).

Furthermore, rare gas is introduced into the processing chamber 100, and the reference plasma is formed. For the light from the reference plasma, the amount of radiation unit side plasma light $P_{m20\_sp}$ is detected (step 1405). The detected or calculated amounts of light, such as $I_{00}$, $I_{r0}$ and $I_{m0}$, are stored in the storage device, such as RAM arranged in the controller, or communicatively connected HDD at a remote site.

In this example, the sequential order of steps 1403 and 1404 may be replaced with each other. In the plasma processing apparatus in a state where the inside of the processing chamber 100 is open to the atmosphere during maintenance, step 1401 of detecting the transmittances on the inner wall surface of the liner 6 nearer to the radiation unit 102 may be performed after the liner 6 is installed in the processing chamber 100 in step 1402.

Next, the processing proceeds to stage 1422 of the operation of wafer processing for manufacturing semiconductor device. After the operation is started, in step 1406, the inside of the processing chamber 100 is high vacuum evacuated to discharge particles formed in the processing chamber 100 during the plasma formation, thus temporarily reducing the pressure to that lower than a pressure at which the wafer processing is performed (step 1406).

Next, in this modified example, plasma for forming a film to protect the inner surface of the processing chamber 100 is formed in this chamber. In the period of the stage of forming the coating film, the interference light that is obtained from the inner wall surface of the liner 6 by the reference light from the external light source 21 being radiated through the radiator port 16 into the processing chamber 100 in a predetermined time is received by the spectroscope 23 through the radiation unit 102, and the amount of light that is the interference measured light $I_m$ is detected by the controller. In the time with no irradiation with reference light, the light from the plasma is received by the spectroscope 23 through the radiation unit 102, and the radiator-side plasma light $P_{m2}$ is detected by the controller (step 1407).

Furthermore, through use of $I_m$ detected in this step and the reference external light $I_{00}$ and $I_b$ detected in steps 1401 to 1405, the amount of interference light $I_f$ from the protective film is calculated by the calculator of the controller. The interference measured light $I_m$ is detected at a predetermined interval and time. Based on the result of $I_m$ detected at the interval, the interference light $I_f$ is calculated. According to the variation in intensity of the interference light $I_f$, the thickness of the protective coating film is calculated by the calculator in the controller.

As described above, the thickness is calculated by preliminarily comparing the film structure on the wafer for testing having a structure equivalent to that on a wafer for device manufacturing with the pattern of the variation in the intensity of interference light $I_f$ having a parameter that is the wavelength with respect to the variation in the film thickness serving as a reference and obtained during processing under a condition equivalent to that in device manufacturing, and by identifying the pattern of the film thickness with the smallest difference from the pattern of the amount of interference light $I_f$ calculated in step 1407 among the patterns serving as the reference. The calculation is further performed by determining the pattern as the film thickness of the coating film at timing (time) in formation of the coating film when the interference measured light $I_m$ is detected.

Such time series data on interference measured light $I_m$ and the interference light $I_f$ and the value of the thickness of the protective coating film is stored in the database in the controller or the storage device communicatively connected with the controller, as information on the data, by means of the operation of the database creator 29.

The pattern of the intensity of the spectrum of the interference light from the inner wall surface of the processing chamber 100 after completion of forming the coating film in step 1407 and the variation of the intensity are detected. According to the amount of the variation, the variation in the state of the coating film is detected by the controller. Also during formation of the coating film, the variation in the pattern of the spectrum of the interference light is detected, and the state of the coating film is detected. In this example, when the controller determines that the magnitudes of the variations exceed a predetermined permissible range, the operation of the plasma processing apparatus for manufacturing devices is stopped and switched to the operation for maintenance, and the transition to the operation for maintenance, or stop of the operation for device manufacturing, and necessity for transition to the operation for maintenance are notified.

Subsequently, as described above, the wafer to be processes is conveyed in a room that is a decompressed space in a vacuum chamber, not shown, communicating with the vacuum chamber wall 5 in a state of being mounted on and held by a distal end of an expandable and retractable arm of a conveyance robot, not shown, into the processing chamber 100 (step 1408), passed onto the sample stage 11, and mounted on the upper face of this stage. Furthermore, the gate valve that hermetically seals and divides the processing chamber 100 and the conveyance chamber is closed.

Next, in a state where the electrode for the electrostatic chuck in the coating film on the upper surface of the sample stage 11 is provided with direct current and the wafer is attracted onto the coating film on the upper surface of the sample stage 11, the process gas is supplied through the through-holes of the shower plate 3 into the processing chamber 100 while the operation of the vacuum pump evacuates the processing chamber 100. The pressure in the processing chamber 100 is set to have a value suitable for processing. Subsequently, the high-frequency power supplied to the inside of the processing chamber 100 forms plasma in an area on and above the sample stage 11 in the processing chamber 100, the high-frequency power supplied to the sample stage 11 forms a bias potential on the wafer, and the etching process for the film layer to be processed in the film structure on the upper surface of the wafer is started (step 1409).

In this embodiment, an etching process in step 1409 includes at least one step. In the case of including multiple steps, the process is performed in each step with different processing conditions, such as a plasma forming condition, magnitude of high-frequency power, and pressure value in the processing chamber 100 (the conditions being referred to as a recipe). In the diagram, the process includes N steps, where N is an arbitrary natural number. As with the step 1406, light from plasma formed in the processing chamber 100 during processing in the step (each step in the case of multiple steps) of the etching process is received by the spectroscope 23 through the light receiving unit 101. The amount of light $P_{m2}$ from the plasma and the amount of interference light (interference measured light) $I_m$ from the inner wall surface of the liner 6 are received at a predetermined interval and a predetermined period, and detected by the controller.

Through use of the radiator-side plasma light $P_{m2}$ and the interference measured light $I_m$ detected in the step (each step in the case of multiple steps) of the etching process, and the reference external light $I_{00}$ and $I_b$ detected in steps 1401 to 1405, the amount of interference light $I_f$ from the protective film is calculated by the calculator of the controller. The pattern having parameters that are multiple wavelengths or the calculated amount of interference light $I_f$ is compared with the patterns of intensity of the interference light $I_f$ in accordance with the variation in the thickness of the film preliminarily obtained as data and serving as the reference. The film thickness corresponding to a pattern having the smallest difference among the patterns serving as the reference is detected as the film thickness at a predetermined time during processing.

The detection of the variation of the thickness of the coating film through use of the interference light is performed at least in a step where a strongly adhesive substance is formed in the plasma or in a step of affecting the coating film to reduce the thickness of the film among multiple steps. On the other hand, in a step of execution under conditions with a small variation in the thickness and material of the film on the surface in the processing chamber 100, the time series data on the amount of plasma light $P_2$ entering on the side of the light receiving unit 101 from the processing chamber 100 is calculated by the controller from data on detection of the radiator-side plasma light $P_{m2}$ in time series, and the ratio of transmission and reflection St and Sr of the splitter 19, which are preliminarily determined according to the specifications. The data is used for OES, and the condition of wafer processing is highly accurately adjusted.

Such time series data on the radiator-side plasma light $P_{m2}$, the interference measured light $I_m$ and the interference light $I_f$ and the value of the thickness of the protective coating film, which are detected in the respective steps, is stored in the database in the controller or the storage device communicatively connected with the controller, as information on the data, by means of the operation of the database creator 29.

When reaching to the end point of the etching process is detected by the controller from the output from the spectroscope 23, the plasma is extinguished based on the instruction signal from the controller, and the supply of the high-frequency power to the sample stage 11 is stopped. Subsequently, the arm of the conveyance robot enters the processing chamber 100, and the wafer is conveyed to the outside of the processing chamber 100 (step 1410).

After the gate valve is closed to reseal the processing chamber 100, gas for cleaning is introduced into the processing chamber 100, plasma is formed in order to remove products having been generated in the processing chamber 100 during the preceding wafer etching and adhered to the surface of the inner wall member and the coating film preliminarily formed in the inner wall of the processing chamber, and plasma cleaning is performed (step 1411). This step 1411 may be performed every time when the process to each wafer is finished, in conformity with the processing condition, the film structure on the wafer, and the material of the member constituting the inner wall of the processing chamber 100. Alternatively, this step may be performed every time when the process on a predetermined number of wafers is finished, in each interval between steps constituting each wafer process.

Also in the cleaning process by means of the plasma, as with step 1407, through use of the radiator-side plasma light $P_{m2}$ and the interference measured light $I_m$, and the preliminarily detected background light $I_b$, the time-series data of the amount of interference light $I_f$ is calculated, the pattern of the interference light $I_f$ at any timing (time) during processing is compared with the preliminarily obtained pattern serving as the reference, and the film thickness of the coating film at the timing is detected. In step 1410 of reducing the thickness of the coating film, when the attainment of the predetermined film thickness of the coating film is determined by the controller, the processing is stopped.

Furthermore, the pattern of the intensity of the spectrum of the interference light from the inner wall surface of the processing chamber 100 after completion of removing the coating film in step 1411 and the variation of the intensity are detected. According to the amount of the variation, the variation in the state of the coating film is detected by the controller. Also during removal of the coating film, the variation in the pattern of the spectrum of the interference light is detected, and the state of the coating film is detected. In this example, when the controller determines that the magnitudes of the variations exceed a predetermined permissible range, the operation of the plasma processing apparatus for manufacturing devices is stopped and switched to the operation for maintenance, and the transition to the operation for maintenance, or stop of the operation for device manufacturing, and necessity for transition to the operation for maintenance are notified.

In this example, when it is determined that the state of cleanliness is equivalent to or can be regarded as the initial state before start of the process for a first wafer at the beginning in the process for manufacturing semiconductor devices because cleaning is performed after completion of the wafer processing, the inner wall surface of the liner 6 in the processing chamber 100, the reference plasma is formed in the processing chamber 100 and the amount of light from the plasma is detected (step 1412) as with steps 1403 and 1405, and the reference light from the external light source 21 is introduced into the processing chamber 100 through the radiation unit 102 and the light-transmitting window 7, and the amount of reference light having passed through the liner 6 in the processing chamber 100 is detected (step 1413).

Next, in step 1414, the amount of background light $I_b$ is detected using the output received by the spectroscope 23 through the radiation unit 102 and the splitter 19, as with step 1404. Among these steps, the sequential order of steps 1413 and 1414 may be replaced with each other. Step 1413 may be performed at any order between steps 1405 to 1410. As described above, in the case where the plasma is temporarily extinguished between multiple step items in step 1409, steps 1413 and 1414 may be performed in each interval.

In the case where there is any processing condition usable as the reference plasma in the step among the step items of step 1409, the amount of light $P_{m20\_sp}$ from the reference plasma may be detected in this step instead of step 1412. In this case, it is desired that the step immediately preceding the step of forming the reference plasma have plasma that can remove the film adhering to the surface of the inner wall of the liner 6. For example, in the case where step item 3 in step 1409 is for forming the reference plasma, it is adequate to remove the film in step item 2. In this step item 2, plasma containing F (fluorine) or Cl (chlorine) may be used as plasma capable of removing the film of accretion.

Furthermore, in steps 1412 to 1414, the calculator of the controller uses the information on the detected amount of radiator-side plasma light $P_{m2\_sp}$ to calculate the amount of light $P_{2\_sp}$ that is from the reference plasma and incident on the radiation-side inner wall surface 104 of the liner 6, and calculates the amount of light $I_{tin}$ radiated from the radiation unit into the processing chamber 100 on the basis of the reference external light $I_0$ and interference measured light $I_m$, Sr and St. The detected or calculated amounts of light, such as $P_{m2\_sp}$, $P_{2\_sp}$, $I_0$ and $I_m$, are stored in the controller or in the storage device communicatively connected to the controller.

Subsequently, presence or absence of a wafer to be processed next is determined (step 1415). When the presence of a wafer is determined (Yes), the processing returns to step 1405, and the process for a wafer for manufacturing devices continues. On the contrary, when absence of a wafer is detected (No), the processing proceeds to step 1416, the operation for manufacturing devices in the plasma processing apparatus is finished (step 1416).

In the stage of the modified example, during the process of forming the coating film in the processing chamber 100 or removing this film, the thickness or state of the coating film can be detected using the interference light, and the result can be used as data for estimating the dimensions of the shape after the processing, which is the wafer processing result in APC. Furthermore, through use not only of data on plasma conditions, such as the gas type, the composition of gas, each flow rate, pressure, a value for power for plasma formation, but also data on the thickness and state of the coating film obtained from the interference light, the dimensions of the shape, and the plasma conditions for achieving the dimensions can be highly accurately estimated. Use of this estimation can improve the reproducibility of wafer processing and production in yield.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma apparatus of processing a wafer disposed in a processing chamber disposed in a vacuum chamber using plasma formed in the processing chamber, comprising:
   a first window which is disposed on a side wall on one side of the vacuum chamber surrounding the processing chamber and through which light emitted from the plasma passes;
   a second window which is disposed on another side opposite to the first window sandwiching the processing chamber and through which external light from outside of the processing chamber passes;
   a light receiver which is disposed outside of the first window and receives and detects light through the first window;
   a light source of the external light disposed outside of the second window;
   a controllable multiport optical branching device disposed between the light source and the second window which has a plurality of optical ports including a first optical port for a first optical path, a second optical port for a second optical path, and a third optical port for a third optical path of light, the first optical path and the second optical path of light being branched from light emitted by the light source, the first optical path of light being directed toward the processing chamber and the second optical path of light being directed to another direction which is different from the direction of the first optical path, and the third optical path of light being branched from light from the second window into yet another direction different from the directions of the first and second optical paths; and
   a detector configured to selectively receive one of the light paths from the controllable optical branching device including light from the first optical port having passed through the processing chamber and been received by the light receiver, and the light from the second optical port branched in the other direction and the light from the third optical port branching in yet another direction, and is configured to detect the light to detect the light having been emitted from the plasma and received by the light receiver using the lights from the controllable optical branching device,
   wherein the apparatus further comprises a controller which is configured to adjust a condition for processing based on a result of the detection by the detector.

2. The plasma apparatus according to claim 1, wherein the detector is configured to detect a state of a surface of an inner wall in the processing chamber using a detected result of each of amounts of light from the controllable optical branching device.

3. The plasma apparatus according to claim 2, wherein the controller is configured to adjust the generating of the plasma using the detected state of the surface of the inner wall in the processing chamber, and data on the light having been emitted from the plasma and detected in the processing, and using a database representing a correlation between a condition of the plasma and dimensions after the wafer processing.

4. The plasma apparatus according to claim 1, wherein the detector is configured to detect a distribution of an intensity or density of the plasma generated in the processing chamber, or a state of a surface of an inner wall of the processing chamber on the one or the other side using a result of detecting each of amounts of the light from the controllable optical branching device, and amounts of light emitted from plasma generated using rare gas introduced into the processing chamber, and introduced into the controllable optical branching device through the first window, and the light introduced into the controllable optical branching device through the second window.

5. The plasma apparatus according to claim 4, wherein the controller is configured to adjust the generating of the plasma using the detected state of the surface of the inner wall in the processing chamber, and data on the light having been emitted from the plasma and detected in the processing, and using a database representing a correlation between a condition of the plasma and dimensions after the wafer processing.

* * * * *